United States Patent [19]
Kobayashi et al.

[11] Patent Number: 5,585,659
[45] Date of Patent: Dec. 17, 1996

[54] COMPLEMENTARY METAL-INSULATOR-SEMICONDUCTOR DEVICES

[75] Inventors: Toshio Kobayashi, Atsugi; Yukio Okazaki, Isehara; Masayasu Miyake, Ebina; Hiroshi Inokawa, Isehara; Takashi Morimoto, Kawasaki, all of Japan

[73] Assignee: Nippon Telegraph And Telephone Corporation, Tokyo, Japan

[21] Appl. No.: 320,690

[22] Filed: Oct. 11, 1994

Related U.S. Application Data

[62] Division of Ser. No. 946,080, Sep. 16, 1992, Pat. No. 5,382,532.

[30] Foreign Application Priority Data

Sep. 17, 1991 [JP] Japan ................................ 3-265298

[51] Int. Cl.⁶ ........................................ H01L 29/76
[52] U.S. Cl. .......................... 257/371; 257/374; 257/388; 257/412; 257/413
[58] Field of Search .................... 257/371, 369, 257/374, 377, 388, 412, 413, 506, 507, 513, 384, 383, 508, 903, 754, 755, 757

[56] References Cited

U.S. PATENT DOCUMENTS

| | | | |
|---|---|---|---|
| 5,014,104 | 5/1991 | Ema | 257/371 |
| 5,026,657 | 6/1991 | Lee et al. | 437/34 |
| 5,066,995 | 11/1991 | Young et al. | 257/371 |

FOREIGN PATENT DOCUMENTS

| | | | |
|---|---|---|---|
| 62-217653 | 9/1987 | Japan | 257/371 |
| 63-13366 | 1/1988 | Japan | 257/371 |
| 63-291457 | 11/1988 | Japan | 257/371 |
| 1-189954 | 7/1989 | Japan | 257/371 |
| 0198077 | 8/1989 | Japan | 437/56 |
| 2-151064 | 6/1990 | Japan | 437/34 |

OTHER PUBLICATIONS

C. K. Lau et al., "A High Performance CMOS Process With Half-Micron Gate And Novel Low-Parasitic Salicide Interconnect Scheme", Hewlett-Packard Laboratories, 1985, pp. 12–13.

J. Y.-C. Sun et al., "0.5 um-Channel CMOS Technology Optimized For Liquid-Nitrogen-Temperature Operation", IEEE, 1986, pp. 236–239.

N. Kasai et al., "0.25 um CMOS Technology Using P+ Polysilicon Gate PMOSFET", IEEE, 1987, pp. 367–370.

B. Davari et al., "A High Performance 0.25 um CMOS Technology", IEEE, 1988, pp. 56–59.

*Primary Examiner*—Minhloan Tran
*Attorney, Agent, or Firm*—Finnegan, Henderson, Farabow, Garrett & Dunner, L.L.P.

[57] ABSTRACT

A method for fabricating semiconductor devices wherein polysilicon gates for complementary-type field-effect semiconductor devices are formed of polysilicon to which impurity doped simultaneously to the polysilicon deposition; the both gates having the dual $N^+/P^+$ polysilicon gate structure, so that the both N- and P-channel transistors are formed as the surface-channel type ones; and therefore, the off-characteristic, the short channel effect, and the controllability of threshold voltage are progressed. More specifically, N- and P-channel MISFETs are provided on a common semiconductor substrate (1); N-type polysilicon (9) doped with N-type impurity is adopted as the gate electrode for the N-channel MISFET; P-type polysilicon (8) doped with P-type impurity is adopted as the gate electrode for the P-channel MISFET; and a narrow region preventing the mutual diffusion of impurities is provided between portions of respective polysilicon.

1 Claim, 24 Drawing Sheets

5,585,659

COMPLEMENTARY METAL-INSULATOR-SEMICONDUCTOR DEVICES

This is a division of application Ser. No. 07/946,080, filed Sep. 16, 1992, now U.S. Pat. No. 5,382,532.

BACKGROUND OF THE INVENTION

1. Field of the Invention

The present invention relates to a method for fabricating field-effect semiconductor devices which having both N- and P-type MISFETs (Metal Insulator Semiconductor Field Effect Transistors) on a common substrate, such as, for example, a complementary-type field-effect semiconductor device.

2. Background Art

Conventionally, two typical types of complementary field-effect semiconductors devices are known. Namely, one comprises N- and P-type MISFETs which are both of the surface-channel type, while the other comprises a surface-channel N-type MISFET and a buried-channel P-type MISFET.

FIG. 64 shows an example of a conventional fabricating technique concerning the latter complementary-type MISFET. In the drawing, a gate electrode of the P-channel MISFET, the polysilicon having the same shape of that of the N-channel MISFET, is adopted. The P-channel MISFET has a buried-channel structure. More specifically, in FIG. 64, the numeral 21 designates the buried-channel layer of the P-channel MISFET.

If the latter technique having the N-type surface-channel and the P-type buried-channel is adopted, there must be an advantage in the fabrication process such that the same N-type polysilicon can be adopted for both gate electrodes (see FIG. 64). However, the buried-channel P-type MISFET is disadvantageous with respect to the current-off characteristics (i.e., subthreshold characteristics), is apt to be affected by the short channel effect, and it is difficult to control the threshold voltage compared with those of the surface-channel type.

On the other hand, the former technique utilizing the surface-channel P-type MISFET is advantageous at smaller scales and at higher-performance levels of the complementary-type field-effect semiconductor device; however, different types of gate electrode material should be utilized for N- and P-type MISFETs respectively. Conventionally, two types of methods for fabricating such a device are known, namely, the complementary-type field-effect semiconductor device having the dual $N^+/P^+$ polysilicon gate structure. Hereinafter, the two methods will be referred to as the first method and the second method.

In the first method, the gate electrode materials are independently deposited, whereby independent gate electrode patterns are formed. However, the first method has the following disadvantages. First, lithographic processing with highly accurate pattern dimensions is required to be performed twice. Furthermore, when the gate electrode patterns for P-type and N-type MISFETs are designed, attention must be paid to the layering accuracy, depending on the lithographic technique used. Furthermore, the second gate electrode material is apt to remain on the side wall of the first formed gate electrode, so that two or more times larger degree of over-etching is required for the second gate electrode forming process compared with that of the first process.

Therefore, the following second method has generally been adopted in order to overcome the above problems. Specifically, undoped polysilicon is utilized for gate electrode materials; gate electrode patterns for both N- and P-channel MISFETs are simultaneously formed during one lithographic process; a mask is formed by means of lithography; impurity is doped twice by means of ion implantation; whereby the gate electrode for the P-channel MISFET is formed of P-type polysilicon and that for the N-channel MISFET is formed of N-type polysilicon.

Alternatively, when the deposition of the undoped polysilicon is completed, impurities respectively required for N- and P-channel regions are doped by means of the ion implantation method, the gas-source diffusion method, or the like; and the electrode patterns are formed by only one lithographic process.

According to the above methods, the lithographic process concerning the gate electrode pattern formation can be completed in one process.

However, the above second process has the following problems.

First, if the thickness of the gate insulator film is reduced when the device is scaled down, the doped impurities are apt to pass through the thin gate oxide film and thereby reach the substrate. Therefore, it is difficult to use high temperature impurity diffusion processes for a long time and to sufficiently raise the concentration of the impurity in the gate polysilicons in the vicinity of the interface between the gate insulator and the gate polysilicons. If the concentration of the impurity in the gate polysilicons in the vicinity of interface between the gate insulator and the gate polysilicons is insufficiently increased, it may cause a problem such that when the MISFET is set to the "ON" status, a thick depletion layer will appear in the gate polysilicon, which causes a drop in the current driving capability of the device.

Second, when the distance between the active regions of the N- and P-channel MISFETs are minimized due to scaling down of the device, impurities doped to the respective gate electrodes are apt to diffuse in the polysilicon electrode and to invade the opposite gate electrode. Therefore, the carrier density of the gate polysilicon will drop, and resistance of the device will increase. For stacked film in particular, comprising an upper layer rich in tungsten, the diffusion speed of the doped impurity in the upper layer is 10 or more times higher than that in the other layers, and therefore, a serious problem may result. The carrier density drop not only causes the resistance to increase but also causes increased depletion layer thickness of the gate electrode when the MISFET is set to the "ON" status (see FIG. 65). In FIG. 65, the numeral 22 designates the low-carrier density region.

SUMMARY OF THE INVENTION

Accordingly, an object of the present invention to provide a method for fabricating complementary-type field-effect semiconductor devices wherein;

the diffusion of different impurities in the respective polysilicons can be prevented at the interface of the N- and P-type polysilicons, namely, the gate electrode for the N- and P-channel MISFETs during continuous thermal treatment; and no layering positional lag occurs between the gate electrode pattern for N-channel MISFET and that of P-channel MISFET after the formation of the gate electrode is completed.

It is another object of the present invention to provide a method for fabricating complementary-type field-effect semiconductor devices wherein; even though the polysilicon to form the gate electrodes of N- and P-channel MISFETs will be independently deposited twice, the gate electrode pattern can be formed by one lithography process, in a manner similar to the conventional technique concerning the formation of the dual N⁺/P⁺ polysilicon gate structure.

It is a further object of the present invention to provide a method for fabricating a complementary-type field-effect semiconductor device wherein the gate polysilicons, electrically insulated by means of a thin insulation region for preventing the respective impurity diffusion, can easily conduct electricity.

The present invention is characterized in utilizing polysilicon in which different impurities are respectively doped on the gate electrodes of the N- and P-channel MISFETs, and the thin insulation region is formed in the boundary of the polysilicons to prevent the respective impurity diffusion.

The present invention is further characterized in that the substrate is divided into two regions, namely, the N-channel MISFET region and P-channel MISFET region. Then, the polysilicon films to be utilized as the gate electrodes of the respective MISFET are formed on the respective regions during the double polysilicon deposition process. Furthermore, during the above process, a thin insulation region for preventing the respective impurity diffusion is formed at the boundary of the polysilicon films. Then, the gate electrode pattern for the N-channel MISFET and that of the P-channel MISFET are simultaneously formed during one lithographic process. As a result, an electrode pattern can be formed wherein the independently deposited polysilicon can be utilized as the gate electrode materials, and no positional lag between the formed electrode patterns occurs.

The present invention is further characterized in that the boundary of the gate electrodes of the N- and P-channel MISFETs are located under contact holes formed on the gate electrodes so as to form an electrical connection between the different gate electrodes and to make it possible to use the conventional pattern data which have been utilized for conventional gate electrode forming processes with a single polysilicon deposition.

The present invention is further characterized in that the gate oxidation relating to the N- and P-channel MISFETs is independently executed, thereby making it possible to respectively set the thicknesses of the gate oxide films to the most appropriate values.

Other characterizing features of the present invention are, for example, as described below. The present invention provides a semiconductor device (see FIGS. 1, 2, and 3), namely, N-channel and P-channel MISFETs on a common semiconductor substrate (1). For the gate electrode of the N-channel MISFET, N-type polysilicon (9), made of polysilicon doped with an N-type impurity, is adopted. For the gate electrode of the P-channel MISFET, P-type polysilicon (8), made of polysilicon doped with a P-type impurity, is adopted. The portions of the respective polysilicons are adjacent to each other via a narrow region so as to prevent the diffusion of impurities to the opposing polysilicons, and the layering positional lag of the gate electrode pattern between the P- and N-channel MISFETs can be prevented.

Alternatively, the present invention is characterized as a semiconductor device (see silicide layer or metal layer (15) in FIG. 2) wherein the N-channel and the P-channel MISFETs are provided on the common semiconductor substrate (1). For the gate electrode for the N-channel MISFET, N-type polysilicon (9), made of polysilicon doped with an N-type impurity, is adopted. For the gate electrode for the P-channel MISFET, P-type polysilicon (8), made of polysilicon doped with a P-type impurity, is adopted. The portions of respective polysilicons are adjacent to each other via a narrow region so as to prevent diffusion of the impurities to the opposing polysilicons; the silicide layer or metal layer (15) is provided on the entire surface or on the portions of the surface of the polysilicons (8 and 9); the silicide layer or the metal layer (15) located on the polysilicons (8 and 9) respectively are connected to each other above the narrow region, or both above and inside the narrow region located between the polysilicons (8 and 9); and thereby the layering positional lag of the gate electrode pattern between the P- and N-channel MISFETs can be prevented.

Alternatively, the present invention is characterized as a semiconductor device (see FIGS. 1 and 3) wherein the N-channel and the P-channel MISFETs are provided on the common semiconductor substrate (1); as for the gate electrode for the N-channel MISFET, N-type polysilicon (9), made of polysilicon doped with an N-type impurity, is adopted; as for the gate electrode for the P-channel MISFET, P-type polysilicon (8), made of polysilicon doped with a P-type impurity, is adopted; the portions of respective polysilicons are adjacent to each other via a narrow region so as to prevent the diffusion of impurities to the opposing polysilicons; no layering positional lag of the gate electrode pattern between the P- and N-channel MISFETs occurs; and among a plurality of contact holes provided for the deposited interlayer insulation films (10 and 11), the contact holes are provided such that the bottom surface of each hole opening area is divided into two parts by two types of gate polysilicons (8 and 9) provided in a narrow region.

Alternatively, the present invention is characterized as a semiconductor device (see FIGS. 1, 2, and 8) wherein the N-channel and the P-channel MISFETs are provided on the common semiconductor substrate (1); and film thicknesses of the respective gate oxide films (19 and 20) differ from each other.

Furthermore, the present invention is characterized as a method for fabricating semiconductor device (FIG. 1) comprising the steps of:

forming a well wherein the N-channel and the P-channel MISFET regions are respectively disposed on the common semiconductor substrate (1) (see FIG. 4, numerals 2 and 3);

depositing a polysilicon film (9) wherein when the gate oxidation for the N (or P) channel-type MISFET is completed, and just when the gate electrode for the N (or P) channel-type MISFET is deposited, an N (or P) type impurity is doped on the polysilicon film (9) (see FIG. 5, wherein a deposition example of gate electrode for the N-channel MISFET polysilicon is shown);

eliminating the polysilicon (9) on the P (or N) channel-type MISFET region by means of etching wherein the polysilicon (9) to be eliminated is previously doped with N (or P)-type impurity (see FIGS. 6 and 7, wherein an elimination example of polysilicon on the P-channel MISFET region is shown);

forming a narrow region wherein, simultaneously with the gate oxidation of the P (or N) channel-type MISFET, the surface of the polysilicon remained on the N (or P) channel MISFET region is oxidized, and the narrow region is continuously formed in the boundary, located among the gate electrode for the P (or N) channel MISFET to be deposited, the boron doped polysilicon, and the gate electrode for N (or P) channel MISFET, so as to prevent the diffusion of impurities to the opposing polysilicons (see FIG. 8, wherein an oxidation example of polysilicon on the N-channel MISFET region is shown);

eliminating the polysilicon (8) on the deposited polysilicon (9) for N (or P) channel-type MISFET, wherein polysilicon film (8) for gate electrode of P (or N) channel-type MISFET, the entire surface thereof being doped with P (or N)-type impurity is deposited, then the polysilicon (8), which is previously doped with deposited P (or N)-type impurity and deposited on the polysilicon (9) for the N (or P) channel-type MISFET, is eliminated (see FIGS. 9 to 13, wherein the elimination example of the polysilicon doped with P (or N) type impurity deposited on the polysilicon for the N-channel MISFET is shown); and simultaneously processing the gate polysilicon wherein the gate electrode pattern is formed by means of a lithographic technique, the resist (13) is masked, and the gate polysilicons (8 and 9) of the N- and P-channel MISFETs are simultaneously processed (see FIGS. 14 to 21).

Alternatively, the present invention is characterized as a method for fabricating semiconductor devices (FIG. 1) comprising the steps of:

well settlement, wherein regions relating to the N- and p-channel MISFETs to be provided on the common semiconductor substrate (1) are settled (see FIG. 4);

a polysilicon film (9) deposition, wherein when the gate oxidation for the N (or P) channel-type MISFET is completed, and just when the gate electrode for N (or P) channel-type MISFET is deposited, an N (or P)-type impurity is doped to the polysilicon film (9) (see FIG. 5, wherein a deposition example of the gate electrode for the N-channel MISFET polysilicon is shown);

a deposition, wherein the surface of the polysilicon film (9) is thinly oxidized so that an oxide film (10) is formed, and then a nitride film (14) is deposited on the entire surface (see FIG. 28);

an etching step wherein etching mask (13) is formed on the N (or P) channel MISFET region by means of a lithographic technique, and the nitride film (14) and thin oxide film (10) are then etched by means of the mask (13) (see FIGS. 29 and 30, wherein an example of etching mask formation on the N-channel MISFET region is shown);

an elimination step wherein after the resist (13) is eliminated, polysilicon (9) doped with N (or P) type impurity is etched by means of the nitride film (14) as an etching mask (see FIG. 31, wherein an etching example of polysilicon doped with an N-type impurity is shown); alternatively, resist mask (13) is eliminated when the etching elimination of N (or P) type polysilicon has been completed continuously on the nitride film (14) and the thin oxide film (10) by means of resist mask (13);

forming a narrow region wherein the oxide film (19), previously oxidized just when the gate oxide film of N (or P) channel MISFET was formed, is eliminated, the gate for P (or N) channel MISFET and side wall of polysilicon (9) doped with N (or P) type impurity are simultaneously oxidized, and a narrow region is formed in the boundary, located between the boron-doped polysilicon (8) to be deposited for gate electrode of P (or N) channel MISFET and the polysilicon (9), so as to prevent the diffusion of the impurities to the opposing polysilicons (see FIG. 32, wherein an example of the oxidized side wall of polysilicon doped with an N-type impurity, oxidized after the gate oxidation of P-channel MISFET had been completed, is shown);

depositing polysilicon (8) doped with a P (or N)-type impurity wherein the thickness of the polysilicon (8) is set rather larger than that of polysilicon (9) doped with N (or P) type impurity (see FIG. 33, wherein a deposition example of polysilicon doped with P-type impurity having rather large thickness compared with another polysilicon doped with an N-type impurity, is shown);

polishing the polysilicon (8) doped with P (or N)-type impurity by means of a chemical mechanical polishing method in which the nitride film (14) is utilized as a stopper (see FIG. 34, wherein a polishing example of polysilicon doped with a P-type impurity is shown);

forming a thin oxide film (10) on the entire surface after the nitride film (14) is eliminated by means of hot phosphoric acid (see FIG. 35); and processing to form the gate electrode pattern by means of a lithographic technique, and the gate polysilicons (8 and 9) of the N- and P-channel MISFETs are simultaneously processed by means of resist (13) as a mask (see FIGS. 14 to 23).

Furthermore, in the above method for fabricating semiconductor devices (FIG. 1), when the gate electrodes are formed, the present invention can be embodied in the additional processes comprising the steps of:

forming a contact hole, wherein an interlayer insulation film (11) is deposited, the contact holes formed such that all or a portion of the bottom surfaces of the formed contact holes on the gate electrode face both the gate polysilicons (8 and 9) respectively relating to the N, and P-channel MISFETs (see FIGS. 24 and 25); and filling metals (12) in the contact holes so as to form electrical connections with the gate polysilicons (8 and 9) of N- and P-channel MISFETs (see FIGS. 26 and 27).

Furthermore, the present invention is characterized as a method for fabricating semiconductor devices (FIG. 2) comprising the steps of:

forming a well wherein the N-channel and the P-channel MISFET regions are respectively settled on the common semiconductor substrate (1) (see FIG. 4);

depositing a polysilicon film (9) wherein when the gate oxidation for N (or P) channel-type MISFET is completed, the polysilicon (9), doped with the N (or P) type impurity, for gate electrodes of N (or P) channel-type MISFET is deposited (see FIG. 5, wherein a deposition example of the gate electrode for the N-channel MISFET polysilicon is shown);

eliminating the polysilicon film (9) on the P (or N) channel-type MISFET region by means of etching (see FIGS. 6 and 7, wherein a elimination example of polysilicon on the P-channel MISFET region is shown);

forming a narrow region, wherein simultaneously with the gate oxidation of the P (or N) channel-type MISFET, the surface of the polysilicon remaining on the N (or P)-channel MISFET region is oxidized, and, continuously, the narrow region is formed in the boundary, located between the gate electrode for P (or N) channel MISFET to be deposited and the gate electrode for N (or P) channel MISFET, so as to prevent the diffusion of impurities to the opposing polysilicons (see FIG. 8, wherein an oxidation example of polysilicon remaining on the N-channel MISFET region is shown);

eliminating the polysilicon (8) on the deposited polysilicon (9) for N (or P) channel-type MISFET, wherein, polysilicon film (8) for gate electrode of P (or N) channel-type MISFET, the entire surface thereof being doped with P (or N) type impurity, is deposited, then the polysilicon (8), which is previously doped with deposited P (or N) type impurity and deposited on the polysilicon (9) for the N (or P) channel-type MISFET, is eliminated (see FIGS. 9 to 13, wherein an elimination example of the polysilicon doped with P-type impurity deposited on the polysilicon for N-channel MISFET is shown);

forming a silicide layer or metal film (15) on the surface of gate polysilicons (8 and 9) for N- and P-channel MISFETs (see FIGS. 36 to 38), covering the entirety of the substrate; and simultaneously processing the gate electrode patterns, formed by means of a lithographic technique, and the silicide layer or metal film (15) together with the gate polysilicons (8 and 9) in which the resist (13) is utilized as a mask (see FIGS. 39 to 41).

Alternatively, the present invention can be characterized as another method for fabricating semiconductor devices (FIG. 2), comprising the steps of:

forming a well, wherein the N-channel and the P-channel MISFET regions are respectively settled on the common semiconductor substrate (1) (see FIG. 4);

depositing the polysilicon film (9) wherein when the gate oxidation for N (or P) channel-type MISFET is completed, the polysilicon (9), doped with the N (or P)-type impurity, for gate electrodes of N (or P) channel-type MISFET is deposited (see FIG. 5, wherein a deposition example of the gate electrode for the N-channel MISFET polysilicon is shown);

eliminating the polysilicon (9) on the P (or N) channel-type MISFET region by means of etching (see FIGS. 6 and 7, wherein an elimination example of polysilicon on the P-channel MISFET region is shown);

forming a narrow region, wherein simultaneous to the gate oxidation of the P (or N) channel-type MISFET, the surface of polysilicon remaining on the N (or P) channel MISFET region is oxidized, and, continuously, the narrow region is formed in the boundary, located between the gate electrode for P (or N) channel MISFET to be deposited and the boron doped polysilicon, so as to prevent diffusion of the impurities to the opposing polysilicons (see FIG. 8, wherein an oxidation example of polysilicon remaining on the N-channel MISFET region is shown);

eliminating the polysilicon (8) on the deposited polysilicon (9) for N (or P) channel-type MISFET, wherein, polysilicon film (8) for gate electrode of P (or N) channel-type MISFET, the entire surface thereof being doped with P (or N)-type impurity, is deposited (see FIG. 9, which shows a deposition example of polysilicon doped with P-type impurity on its entire surface), then the polysilicon (8) previously deposited on the polysilicon (9) for the N (of P) channel-type MISFET, is eliminated (see FIGS. 10 to 14, wherein the elimination example of the polysilicon deposited on the polysilicon for N-channel MISFET is shown);

processing gate electrode patterns formed by means of a lithographic technique, wherein gate polysilicons (8 and 9) for N- and P-channel MISFETs are simultaneously processed by means of resist (18) as a mask (see FIGS. 15 to 23); and selective growing, wherein the silicide layer or metal film (15) only on the upper surface of processed gate polysilicons (8 and 9) is selectively grown (see FIG. 44 to 46).

Furthermore, the present invention can be characterized as a method for fabricating semiconductor devices (FIG. 3) comprising the steps of:

forming a well, wherein the N-channel and the P-channel MISFET regions are respectively settled on the common semiconductor substrate (1) (see FIG. 4);

depositing polysilicon film (9), wherein when the gate oxidation for N (or P) channel-type MISFET is completed, the polysilicon (9) for gate electrodes of the N (or P) channel-type MISFET, doped with the N (or P) type impurity, is deposited (see FIG. 5, wherein a deposition example of a gate electrode for the N-channel MISFET polysilicon is shown);

elimination the polysilicon (9) on the P (or N) channel-type MISFET region by means of etching (see FIGS. 6 and 7, wherein an elimination example of polysilicon on the P-channel MISFET region is shown);

forming a narrow region, which will be executed, if necessary, simultaneously with an oxidative forming of the gate oxide film (20), having a film thickness which differs from the oxide film (19) on the N (or P)-channel MISFET, on the P (or N) channel-type MISFET, and, continuously, the narrow region is formed in the boundary, located between the gate electrode for the P (or N) channel MISFET to be deposited and the boron doped polysilicon, so as to prevent diffusion of the impurities to the opposing polysilicons (see FIG. 8, wherein an oxidation example of polysilicon remaining on the N-channel MISFET region, executed simultaneously with gate oxidation of P-channel MISFET, is shown);

eliminating polysilicon (8), wherein polysilicon film (8), provided for the gate electrode in the P (or N) channel-type MISFET, is doped with P (or N) type impurity on its entire surface, and is deposited (see FIGS. 9 and 48, wherein deposition example of polysilicon film (8), doped with P-type impurity on its entire surface, is shown), and the polysilicon (8), deposited on the previously deposited polysilicon for N (or P) channel-type MISFET, is eliminated (see FIGS. 49 and 50, wherein an elimination example of the polysilicon, located on the previous polysilicon for N-channel MISFET, is shown); and simultaneous processing, wherein gate electrode patterns are formed by means of a lithographic technique (see FIGS. 51 to 55), and gate polysilicons (8 and 9) for N- and P-channel MISFETs are simultaneously processed using the resist (13) as a mask (see FIGS. 56 to 63).

Therefore, according to the present invention, gate electrodes for the N- and P-channel MISFETs contained in the complementary-type MIS circuit can be embodied by the independently deposited polysilicon. Furthermore, the polysilicons for N- and P-channel are respectively doped with different impurities. As a result, both P- and N-channel MISFETs can be embodied as the surface-channel type device, so that short channel effects can be decreased, and channel-length reduction can be improved. Furthermore, as for the gate electrodes, the doped polysilicon, impurity doped at the time of deposition, can be adopted. Accordingly, concentration of the impurity adjacent to the gate insulator film and the interface of gate polysilicons can be satisfactorily increased for both the P- and N-channel MISFETs.

Hence, even when the MISFETs are set to the "ON" status, it is possible to prevent a thick depletion layer appearing in the polysilicon, namely, the gate electrode. In other words, the MISFET can be realized without a drop in the current drive capacity.

Furthermore, according to the present invention, the insulation film is provided in the boundary, located between the two types of polysilicon, so as to prevent diffusion of the impurities to the opposing polysilicons. Accordingly, the characteristic fluctuations caused by the high resistance region and by the impurity reaching the opposite gate region, which are both due to the respective impurity diffusion, can be prevented.

Furthermore, according to the present invention, gate patterns of N- and P-channel MISFETs can be formed only by one lithographic process in a manner similar to the conventional method wherein gate electrodes for the N- and P-channel MISFETs are composed of one polysilicon doped with one impurity, or to another conventional method wherein impurities for gate electrodes for the N- and P-channel MISFETs are doped after the polysilicon deposition is completed. Accordingly, gate electrode patterns for the N- and P-channel MISFETs can be formed without respective layering positional lag, and the same gate electrode patterns, which have been conventionally utilized, can continue to be utilized.

The "polysilicon" described above contains an impurity doped single layered polysilicon film; a stacked layered polysilicon film contains the above single layered polysilicon film and other sequentially layered film richly doped with tungsten, a stacked film wherein the above single layered and stacked layered polysilicon films are joined, and other polysilicons stacked with other films.

DESCRIPTION OF THE PREFERRED EMBODIMENTS

The embodiments of the present invention contain the structures of semiconductor devices and method for fabricating those devices. The correspondence between the embodiments and drawings is as follows.

Figure 1:
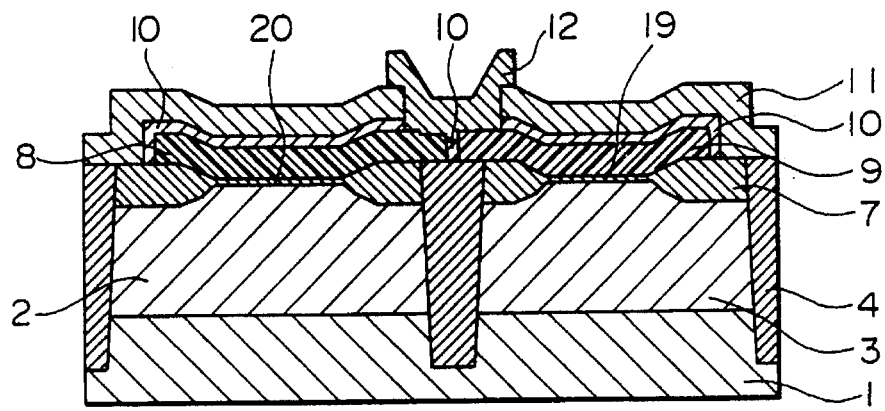
FIG. 1 is a schematic cross-sectional view of a 0semiconductor device wherein polysilicons (8 and 9) are adopted as the gate electrodes according to the first embodiment of present invention.
Figure 2:
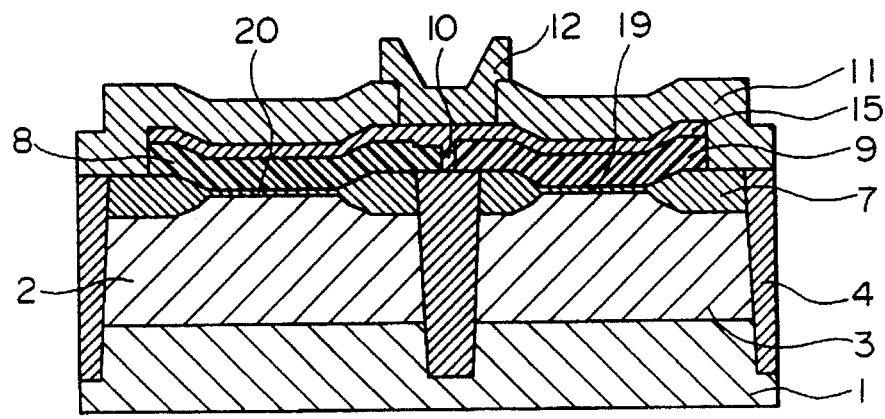
FIG. 2 is a schematic cross-sectional view of a semiconductor device wherein a multi-layered structure, containing the polysilicons (8 and 9) and metal film (15), is adopted as the gate electrodes according to the second embodiment of the present invention.
Figure 3:
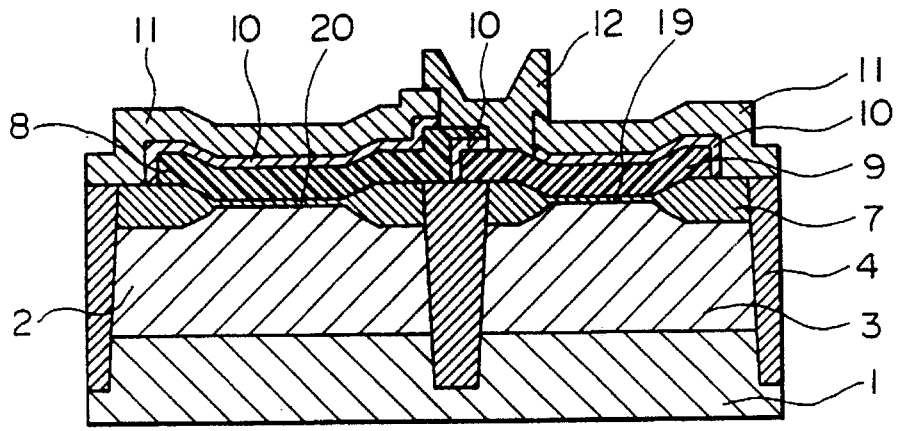
FIG. 3 is a schematic cross-sectional view of a semiconductor device, wherein a portion of the P-type polysilicon (8) is adjacent to the N-type polysilicon (9), according to the third embodiment of the present invention.

FIGS. 1, 2, and 3 respectively show the first, second, and third embodiments relating to the structures of semiconductor devices. However, the method for fabricating semiconductor devices are embodied by the following five embodiments.

That is, the fourth and fifth embodiments are respectively embodied as methods for fabricating semiconductor device shown in FIG. 1 according to the first embodiment;

the sixth and seventh embodiments are respectively embodied as methods for fabricating semiconductor device shown in FIG. 2 according to the second embodiment; and the eighth embodiment is embodied as a method for fabricating semiconductor device shown in FIG. 3 according to the third embodiment.

The correspondence between the fourth to eighth embodiments respectively concerning the fabricating methods and drawings is as follows.

Figure 66:
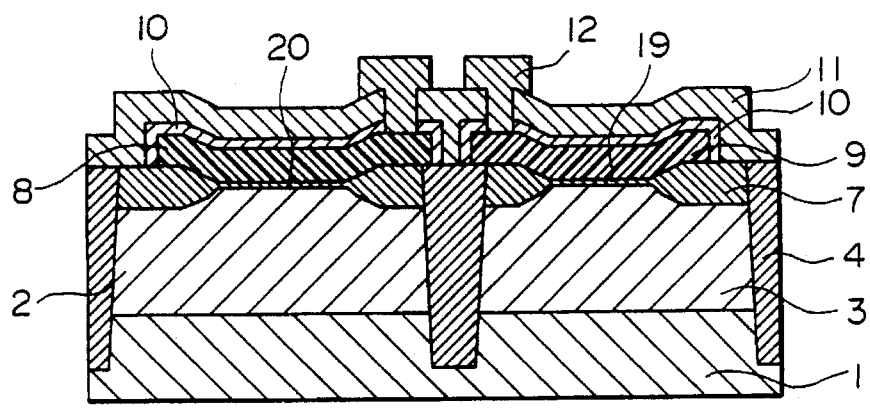
FIG. 66 is a schematic cross-sectional view of a semiconductor device according to the ninth embodiment of the present invention, wherein the N-channel MISFET and the gate electrode for the P-channel MISFET are not adjacent to each other.
Figure 67:
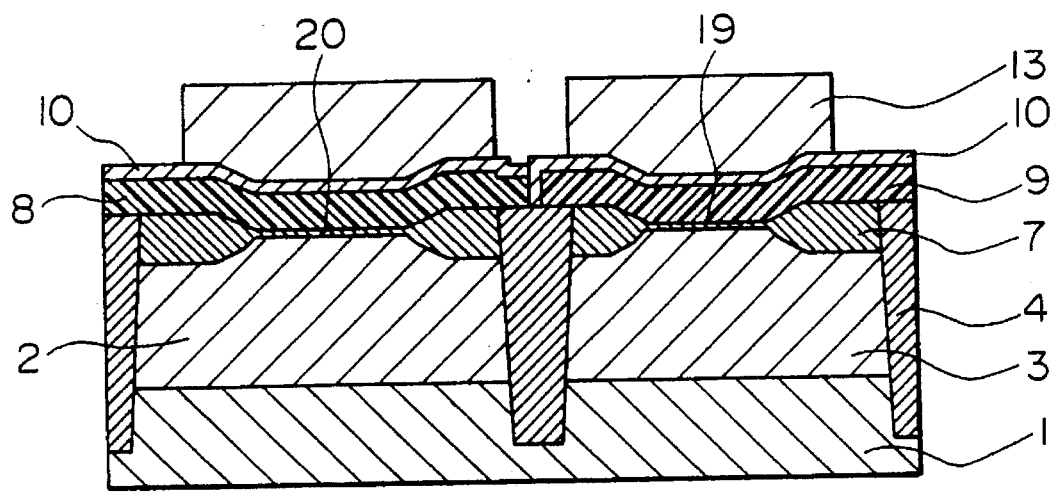
FIG. 67 is a schematic cross-sectional view during the process wherein the thin oxide film (10), formed on the entire surface of gate polysilicons (S and 9), is coated with resist (13) by means of a lithographic technique, so that the gate pattern is formed.

That is, the fourth embodiment corresponds to FIGS. 4 to 27; the fifth embodiment corresponds to FIGS. 4, 5, 14 to 27 and 28 to 35; the sixth embodiment corresponds to FIGS. 4 to 13, or 4, 5, 25 to 27, 28 to 34, and 36 to 43; the seventh embodiment corresponds to FIGS. 4 to 23 and FIGS. 42, 43, and 44 to 47; the eighth embodiment corresponds to FIGS. 4 to 9, FIGS. 48 to 63 and the cross-sectional view during the process (FIG. 3) modified from FIGS. 17 to 27; the ninth embodiment corresponds to FIG. 66; the tenth embodiment corresponds to FIGS. 4 to 27, and 67 and 68.

FIRST EMBODIMENT

FIG. 1 shows the first embodiment of the present invention, wherein polysilicon is adopted as a gate electrode. In FIG. 1, the numeral 1 designates a low impurity concentration silicon substrate, the numeral 2 designates an N-well region, the numeral 3 designates a P-well region, the numeral 4 designates an isolation region between the N-well and the P-well, the numeral 7 designates an insulator film for interdevice isolation, the numeral 8 designates a boron-doped polysilicon corresponding to the gate electrode for the P-channel MISFET, the numeral 9 designates a phosphorus-doped polysilicon corresponding to the gate electrode for the N-channel MISFET, the numeral 10 designates an oxide film, namely an oxidized polysilicon, the numeral 11 designates an interlayer insulation film, the numeral 12 designates a metal electrode for wiring, making contact with gate electrode polysilicons (8 and 9).

Furthermore, the numerals 19 and 20 respectively designate gate oxide films utilized for the N- and P-channel MISFETs. The source and drain regions of N- and P-channel MISFETs are not located just below the gate, which are located on the region at the terminus of the gate electrodes and the region where the gate electrodes do not exist, and, therefore, they are not shown in FIG. 1.

The embodiment in FIG. 1 is structurally characterized in gate polysilicons (8 and 9), respectively doped with P-type and N-type impurities, being adopted as the different type gate electrode materials for the complementary-type field-effect semiconductor device; a narrow region, embodied by the insulator layer (10), etc., being provided at the boundary of polysilicons acting as the gate electrodes so as to prevent mutual diffusion; no layering positional lag appearing between the gate electrode patterns of the P-channel and the N-channel MISFETs; and metal electrode being formed for wiring by means of forming the bottom of the contact holes which are provided for gate electrodes of complementary-type field-effect semiconductor device and is extending over the both gate polysilicons (8 and 9) via the narrow region.

SECOND EMBODIMENT

FIG. 2 shows the second embodiment of the present invention, wherein a double layered structure, consisting of a polysilicon and a silicide layer or consisting of a polysilicon and a metal film, is adopted as a gate electrode. In the drawing, components corresponding to those of FIG. 1 are labeled with the same numerals. The second embodiment shown in FIG. 2 is characterized in a silicide layer or a refractory metal layer, designated by the numeral 15, being selectively provided on the gate polysilicons (8 and 9) including the narrow region. Therefore, the margin of contact hole formation can be increased and the gate electrode resistance can be decreased.

THIRD EMBODIMENT

FIG. 3 shows the third embodiment of the present invention. The third embodiment is characterized in a structure wherein a portion of a P-type doped polysilicon electrode (8) is laid on the N-type doped polysilicon electrode (9). At the boundary of the boron-doped polysilicon (8) and the phosphorus-doped polysilicon (9), a narrow region, embodied as thin insulator layer (10), etc., is formed in order to prevent mutual diffusion.

The contact holes for both polysilicons (8 and 9) are formed so as to expose both of the N-type doped polysilicon (9) and the P-type doped polysilicon (8) to the contact holes, in other words, contact hole positions are biased in order to ensure contact with both polysilicons as shown in FIG. 3.

In a modification of the embodiment in FIG. 3, the silicide layer or the refractory metal layer can be selectively laid on the gate polysilicons (8 and 9), and therefore, the gate electrode can be composed in the stacked layer style in a manner similar to FIG. 2.

FOURTH EMBODIMENT

Next, the fourth embodiment the present invention, an example of a method for fabricating semiconductor devices shown in FIG. 1, will be described, reference being made to FIGS. 4 to 27.

Figure 4:
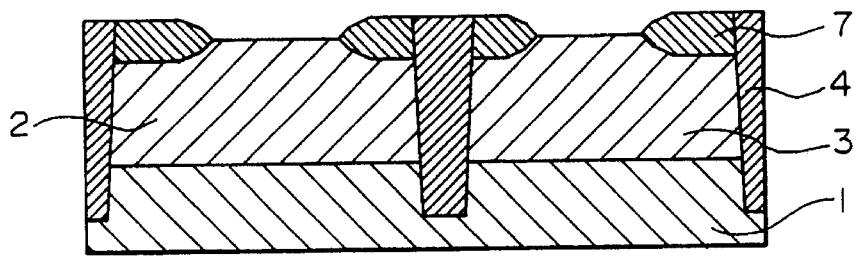
FIG. 4 is a cross-sectional view during the process of fabrication of the semiconductor devices according to the first embodiment wherein device regions, isolation regions (4 and 7), P-well (3) and N-well (2) are formed in the silicon substrate (1)

First, the device region, the isolation regions (4 and 7), the P-well (3), and the N-well (2) are formed on the silicon substrate (1) as shown in FIG. 4. The substrate (1) can be embodied by a monocrystal substrate, SOI substrate, and the like.

Figure 5:
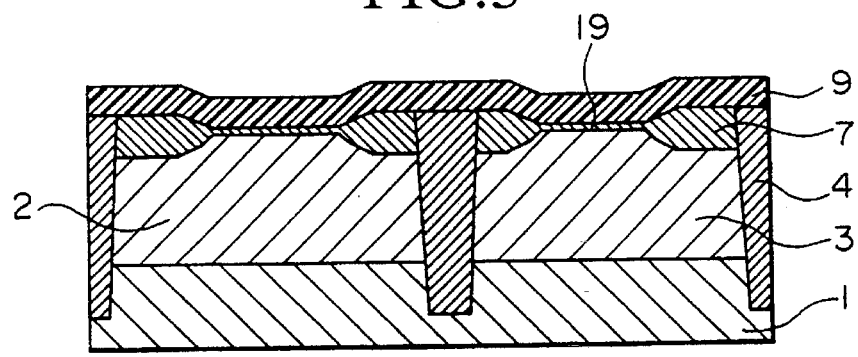
FIG. 5 is a cross-sectional view during the process wherein channel doping is executed on the respective active region of MISFETs in the P-well (3) and the N-well (2), a gate oxide film (19) of N-channel MISFET is formed, and a phosphorus-doped polysilicon (9) is deposited.

Then, channel doping is executed for the respective active region of MISFETs in the P-well (3) and the N-well (2), the gate oxide film (19) is formed, and the phosphorus-doped polysilicon (9) is deposited (FIG. 5). In this process, the gate oxide film (19) becomes the gate oxide film of the N-channel MISFET having the phosphorus-doped polysilicon (9) as the gate electrode.

Figure 6:
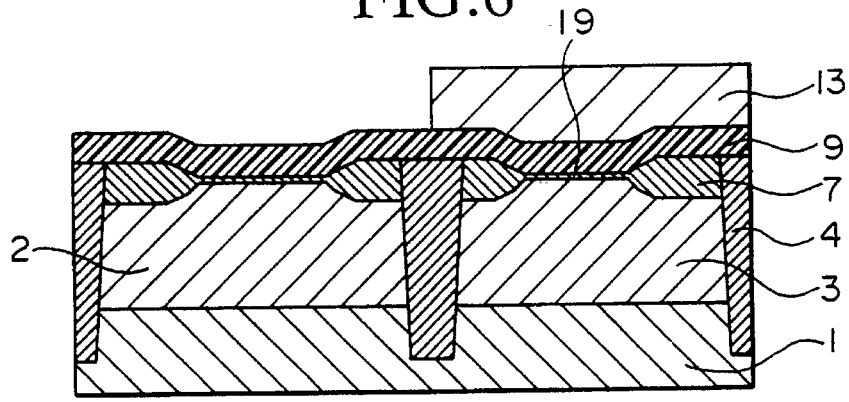
FIG. 6 is a cross-sectional view during the process of forming the etching mask (13) on the N-channel MISFET region by means of a lithographic technique.

Then, etching mask (13) is formed on the N-channel MISFET region by means of a lithographic technique as shown in FIG. 6. Then, only the unnecessary phosphorus-doped polysilicon (9) is eliminated by means of mask (13) and by a dry etching technique, ECR ion stream etching method for example, having a high etching rate of polysilicon to the oxide film. Then, the used mask (13) is eliminated, and the oxidatively formed oxide film (19) is further eliminated when gate oxide film formation of the N-channel MISFET is executed. Then, gate oxidation for the P-channel MISFET is executed and the gate oxide film (20) is formed.

Figure 9:
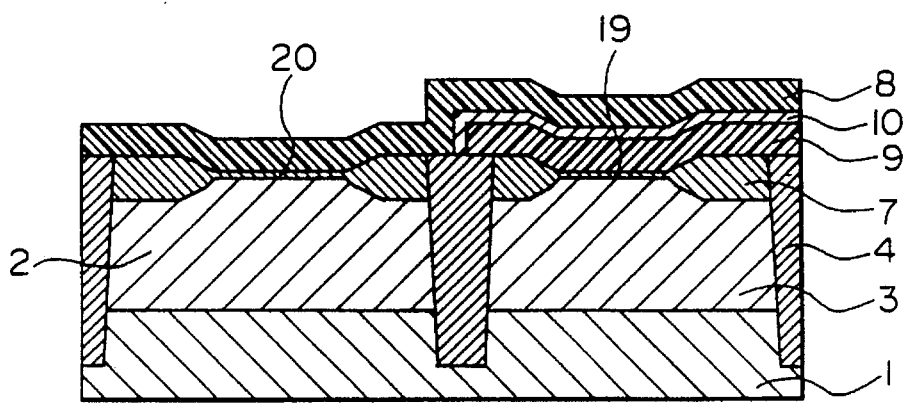
FIG. 9 is a cross-sectional view during the process wherein, continuous to the above process in FIG. 8, channel doping for P-channel MISFET is executed if necessary, and boron-doped polysilicon (8) is deposited as a gate electrode material for the P-channel MISFET.

There is no need to coincide the film thickness of gate oxide film (20) and that of gate oxide film (19) for the N-channel MISFET. Therefore, the thicknesses can differ if necessary. Furthermore, the surface of previously deposited phosphorus-doped polysilicon (9) of the gate electrode for the N-channel MISFET is simultaneously oxidized, so that oxide film (10) is formed on the polysilicon. Continuously, a narrow region, preventing the mutual impurity diffusion, is formed in the boundary between the polysilicon (9) and boron-doped polysilicon (8) for the gate electrode for the P-channel MISFET to be deposited. After the gate oxidation for the P-channel MISFET is completed, if necessary, channel doping for P-channel MISFET may be executed before or after the gate oxidation, so that the gate electrode material for the P-channel MISFET, namely, the boron-doped polysilicon (8) may be deposited as shown in FIG. 9.

Figure 10:
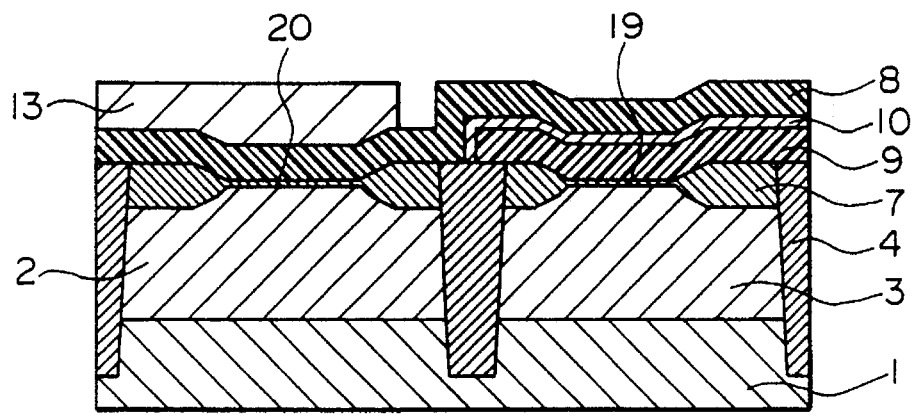
FIG. 10 is a cross-sectional view during the process wherein a resist (13), having almost the same thickness as the polysilicon gate electrode (9) of the N-channel MISFET and having a rather narrow region on the P-channel MISFET region compared with the P-channel MISFET region, remains using of a lithographic technique.

When the deposition is completed, a resist (13), having a rather narrow region on the P-channel MISFET compared with the P-channel MISFET region, remains by means of a lithographic technique. The thickness of resist (13) is almost the same as that of the polysilicon gate electrode (9) of N-channel MISFET as shown in FIG. 10. Then, the resist is further coated and resist layer (13) having a flat surface is formed. In several kinds of patterns, the resist layer (13) will be satisfactory flat only by coating. In this case, the lithography step shown in FIG. 9 will not be required.

Figure 12:
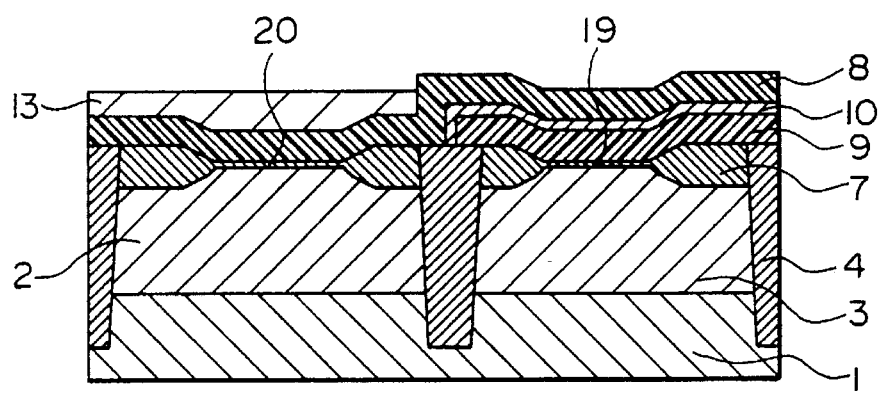
FIG. 12 is a cross-sectional view during the process wherein boron-doped polysilicon (8), formed on the phosphorus-doped polysilicon (9) and the entire surface thereof is etched back, is exposed.
Figure 13:
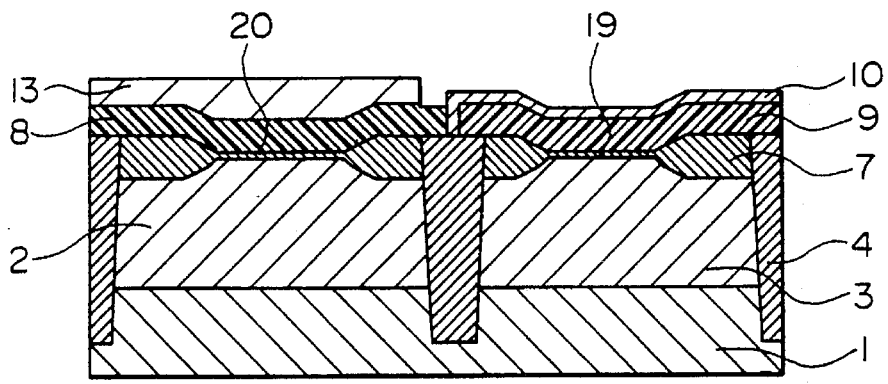
FIG. 13 is a cross-sectional view during the process wherein previously exposed boron-doped polysilicon (8) is etched by means of thin oxide film (10), covering the surface of phosphorus-doped polysilicon (9), as a stopper.
Figure 14:
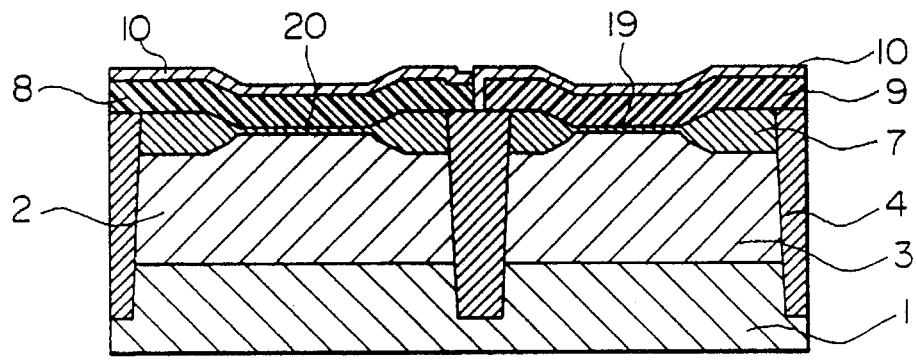
FIG. 14 is a cross-sectional view during the process wherein resin (13) is eliminated, thin oxide film (10) is formed on the phosphorus-doped polysilicon (8), and terminates the deposition of gate electrode material for P- and N-channel MISFETs.
Figure 15:
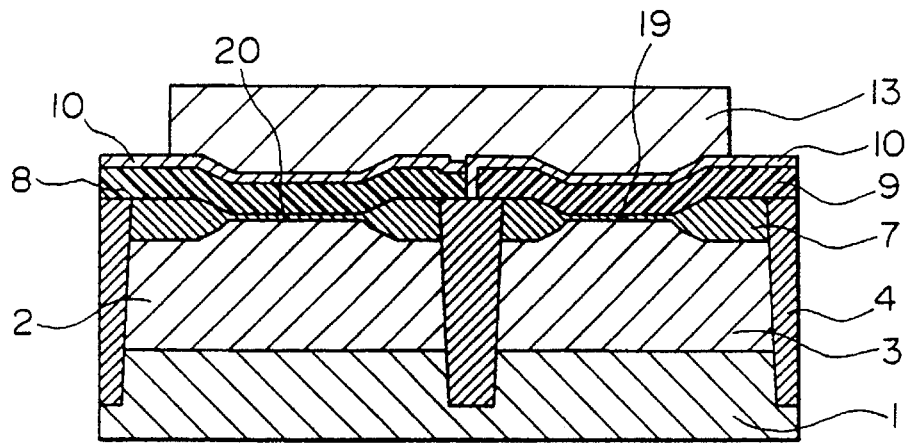
FIG. 15 is a cross-sectional view during the process wherein thin oxide film (10), formed on the entire surface of the gate polysilicons (8 and 9), is coated with resist (13), and a gate pattern is formed by means of a lithographic technique.
Figure 16:
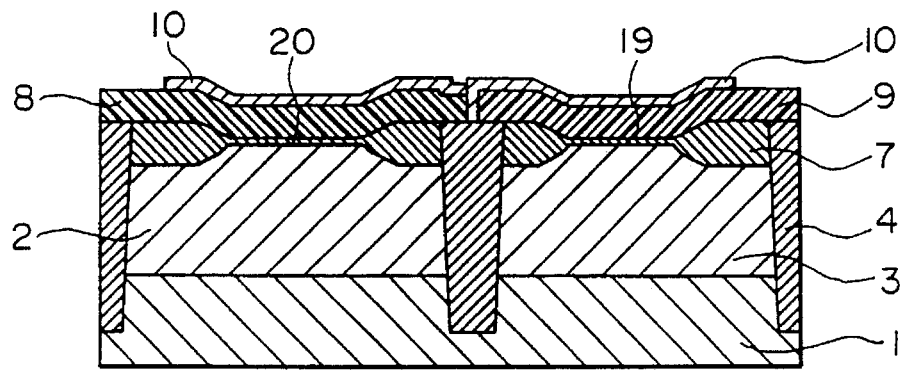
FIG. 16 is a cross-sectional view during the process wherein thin oxide film (10) on the gate polysilicons (8 and 9) is etched by means of resist pattern (13) as an etching mask, then the resist (13) is eliminated, and a mask (10) is formed so as to etch the polysilicons (8 and 9)

Continuously boron-doped polysilicon (8), formed on the phosphorus-doped polysilicon (9), is exposed by means of etching back the entire surface as shown in FIG. 12. Furthermore, as shown in FIG. 13, previously exposed boron-doped polysilicon (8) is etched by means of a dry etching technique, the ECR ion stream etching method for example, has a high etching rate of polysilicon on the oxide film. Then, etching is stopped when the buried phosphorus-doped polysilicon (9) is exposed. In this case, the thin oxide film (10) covering the phosphorus-doped polysilicon (9) acts as the stopper. When the resist (13) is eliminated and the thin oxide film (10) is formed on the boron -doped polysilicon (8), as shown in FIG. 14, the deposition process of gate electrode materials for P- and N-channel MISFETs is terminated.

Then, the gate electrode pattern is formed by means of a lithographic technique, and a mask for polysilicon etching is formed. The thin oxide film (10) is formed over the entire surface of polysilicons (8 and 9) in the first place by means of thermal oxidation, then resist (13) is coated on the film (10), the gate pattern is formed by means of a lithographic technique (see FIG. 15), the thin oxide film (10) on the gate polysilicons (8 and 9) is etched by means of the pattern of resist (13) as the etching mask, the resist (13) is eliminated, and the mask for the oxide film (10) is formed so as to etch the gate polysilicons (8 and 9). Then, the gate pattern is processed by means of a dry etching technique, embodied by ECR 1on stream etching for example, having the high etching rate of polysilicon to the oxide film, and of the formed oxide film (10) as the mask. Incidentally, even though the gate fabrication is executed by means of the thin oxide film (10) as the mask according to the embodiment, the gate polysilicons (8 and 9) can be processed with the thin oxide film (10) as the mask. More specifically, the resist pattern (13) formed for the gate electrode can also be adopted as the mask.

Figure 17:
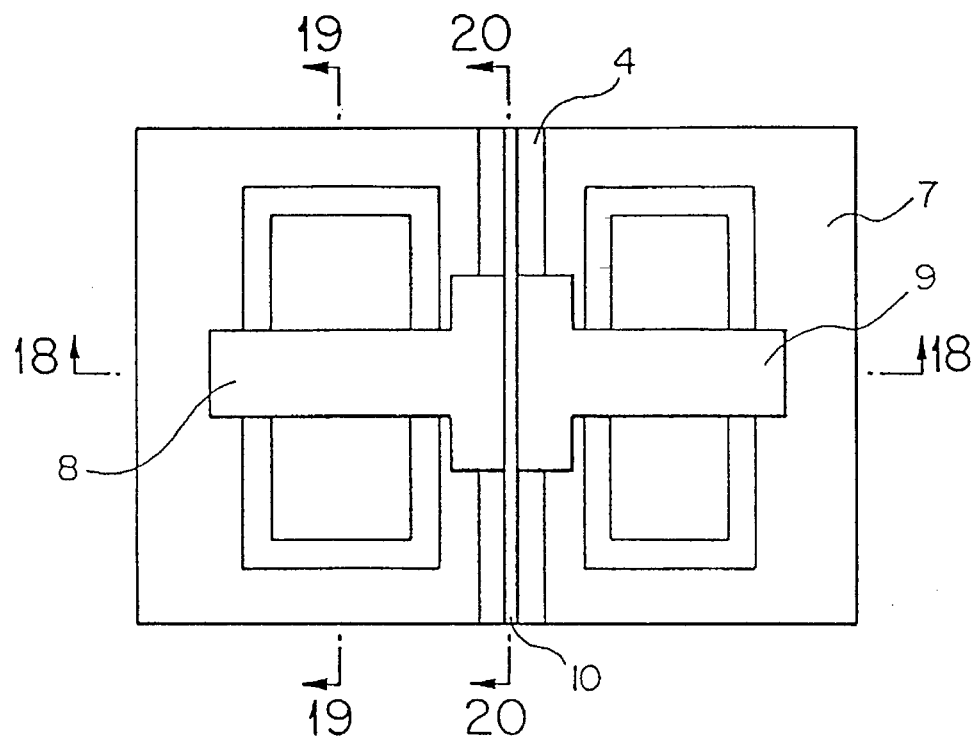
FIG. 17 is a schematic top view of a structure wherein polysilicon layer (8 and 9) are etched by means of previously formed oxide film mask (10), and whereby a prespecified gate pattern is formed.
Figure 18:
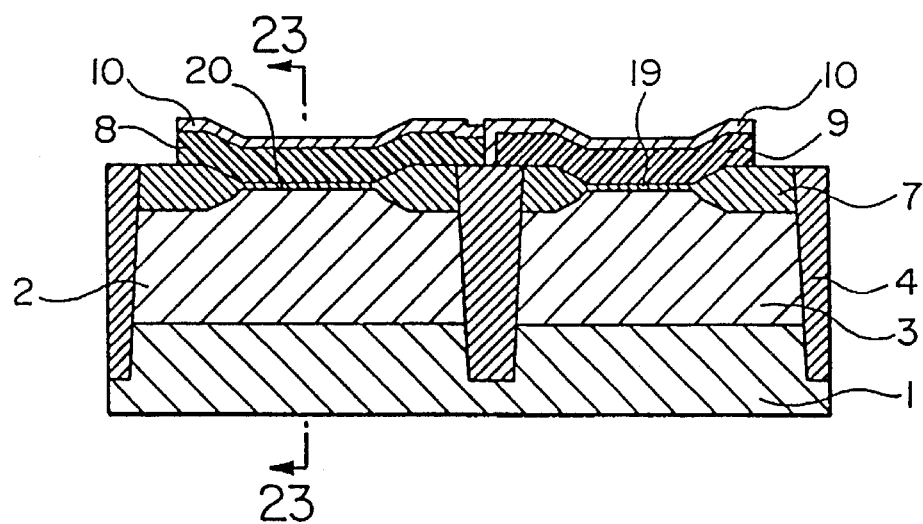
FIG. 18 is a schematic cross-sectional view of the 18—18 section of the structure shown in FIG. 17.
Figure 19:
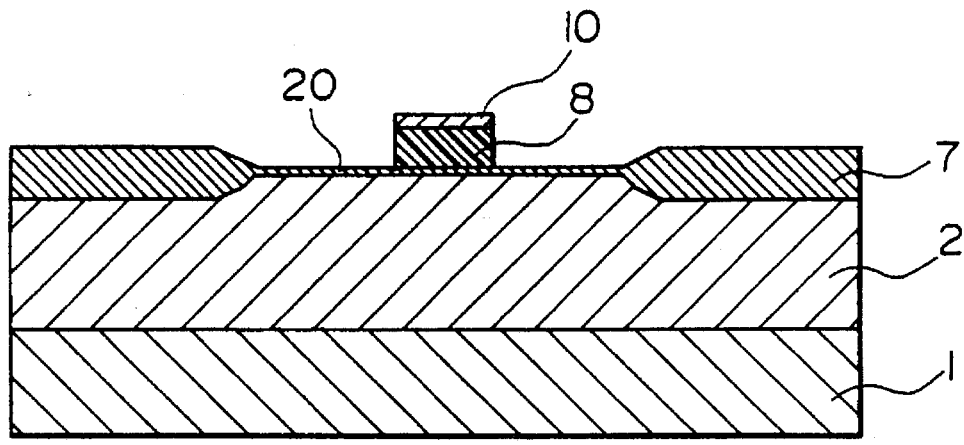
FIG. 19 is a schematic cross-sectional view of the 19—19 section of the structure shown in FIGS. 17 and 18.
Figure 20:
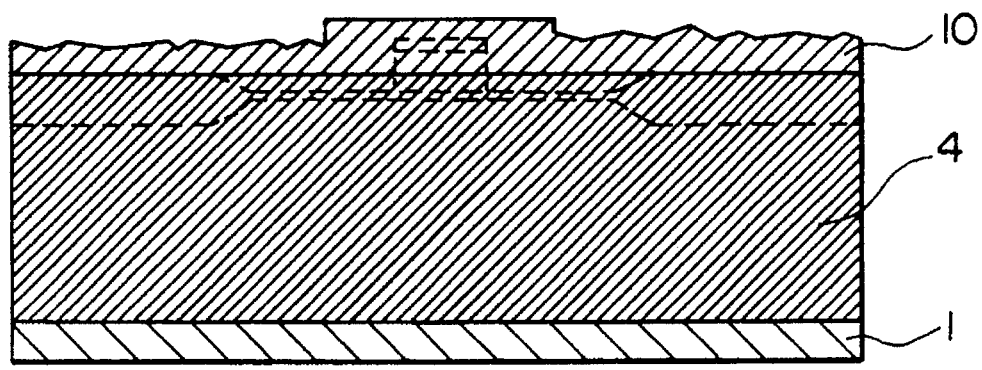
FIG. 20 is a schematic cross-sectional view of the 20—20 section of the structure shown in FIGS. 17 and 18.

After the polysilicon is processed, the thin oxide film (10), which is previously provided on the region between the phosphorus-doped polysilicon (9) and the boron-doped polysilicon (8) excepting the region of the gate pattern remains as a wall, as shown in FIGS. 17 to 20. FIG. 17 shows the top view while the thin oxide film (10) on the gate polysilicon is not shown for clarity. FIG. 18 is a schematic cross-sectional view in the 18—18 section of the structure shown in FIG. 17, the sectional direction of which is the same as those of FIGS. 1 to 16; FIG. 19 is a schematic cross-sectional view in the 19—19 section of the structure shown in FIGS. 17 and 18; and FIG. 20 is a schematic cross-sectional view in the 20—20 section of the structure shown in FIGS. 17 and 18.

According to FIGS. 17 to 20, it is understood that the thin oxide film (10), existing in the boundary between the phosphorus-doped polysilicon (9) and the boron-doped polysilicon, still remains as a wall in the area, outside of the gate electrode pattern region (8 and 9), in this process. However, the thin oxide film (10), remaining as the wall, is so thin that the film can be easily eliminated by means of the dilute hydrofluoric acid.

Figure 21:
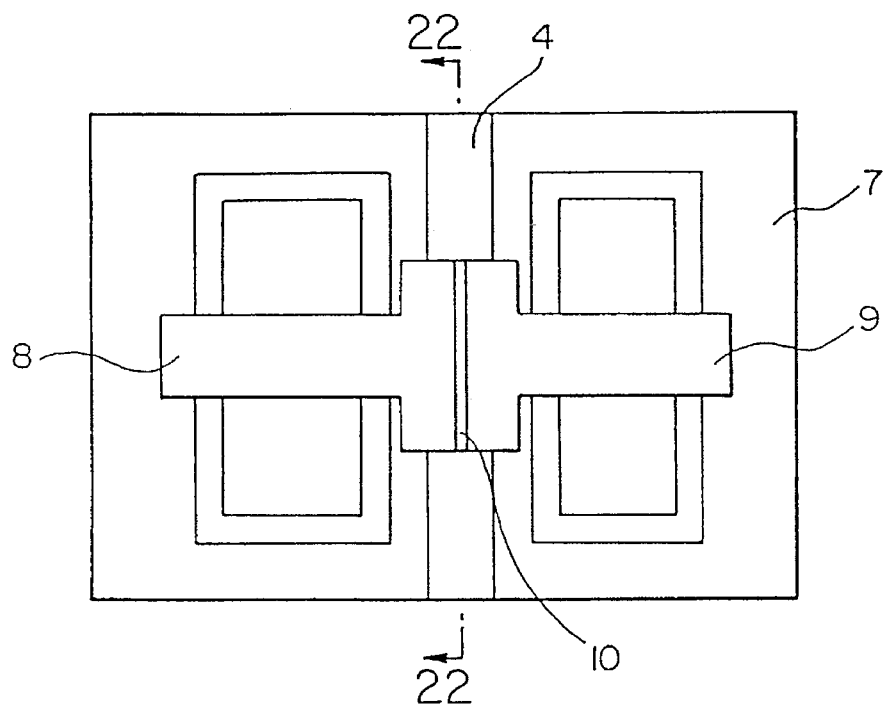
FIG. 21 is a schematic surface pattern view of the structure wherein the thin oxide film (10), previously remaining as a wall, is eliminated.
Figure 22:
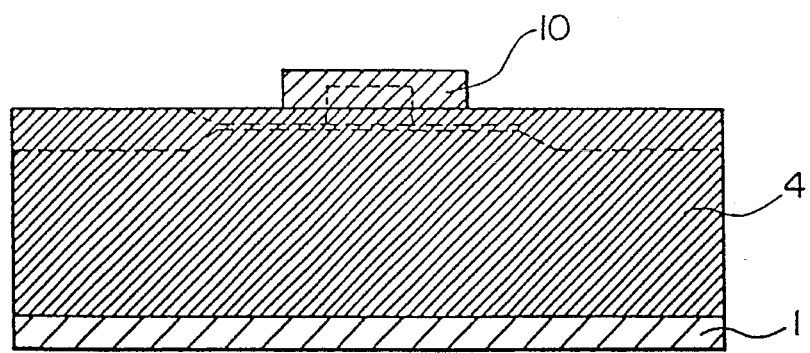
FIG. 22 is a schematic cross-sectional view of the 22—22 section of the structure shown in FIG. 21.

FIG. 21 is a schematic top view of the structure wherein the thin oxide film (10), previously remaining as a wall, is eliminated; and FIG. 22 is a schematic cross-sectional view in the 22—22 section, similar to FIG. 20, of the structure shown in FIG. 21.

In FIG. 22, the wall of thin oxide film (10), still remaining in the process of FIG. 20, has been eliminated. Then, the surfaces of the gate polysilicons (8 and 9), patterns of which are formed, are oxidized. Furthermore, ion implantation for the source and the drain will be sequentially executed before or after the oxidation process. According to the ion implantation for the source and drain, the masks for the P- and N-channels are separately formed by means of a lithographic technique.

Figure 23:
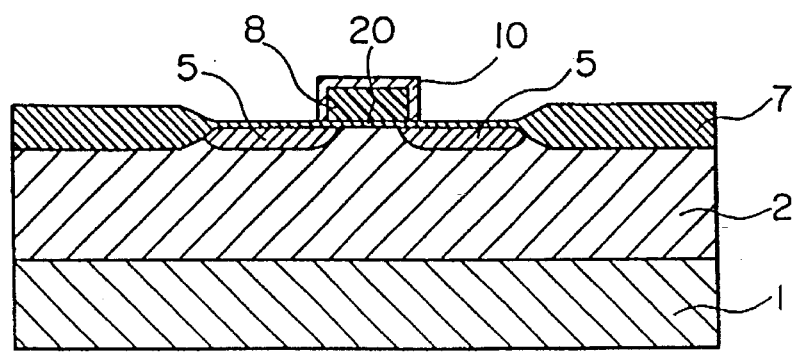
FIG. 23 is a cross-sectional view during the process, similar to a schematic cross-sectional view of the 19—19 section shown in FIG. 17, wherein the surfaces of gate polysilicons (8 and 9), the patterns of which are formed and oxidized (ion implantation for the source and the drain will be sequentially executed before or after the oxidation process)
Figure 24:
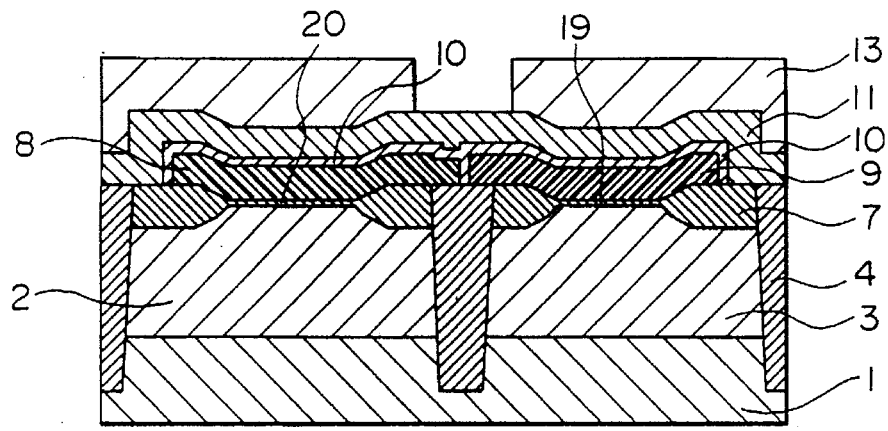
FIG. 24 is a cross-sectional view during the process wherein interlayer insulation film (11) is deposited after the process of FIG. 23, and contact hole patterns are formed by means of a lithographic technique.

FIG. 23 is a schematic cross-sectional view corresponding to the 19—19 section of FIG. 17, that is, a drawing corresponding to the cross-sectional view of the P-channel MISFET. Therefore, the source and the drain which are previously formed by means of ion implantation, are respectively become high impurity P-type semiconductor regions (5). As for the N-channel MISFET region, the similar shaped source and drain consist of high impurity N-type semiconductors are formed (not shown). Then, the interlayer insulation film (11) is deposited, and contact hole patterns are formed by means of a lithographic technique (see FIG. 24).

Figure 25:
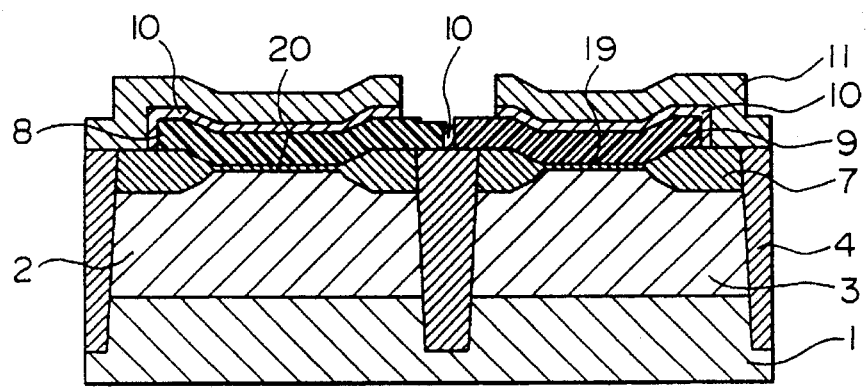
FIG. 25 is a cross-sectional view during the process wherein the interlayer insulation film (11) is etched by means of the resist (13) as the mask so that contact holes are formed.
Figure 26:
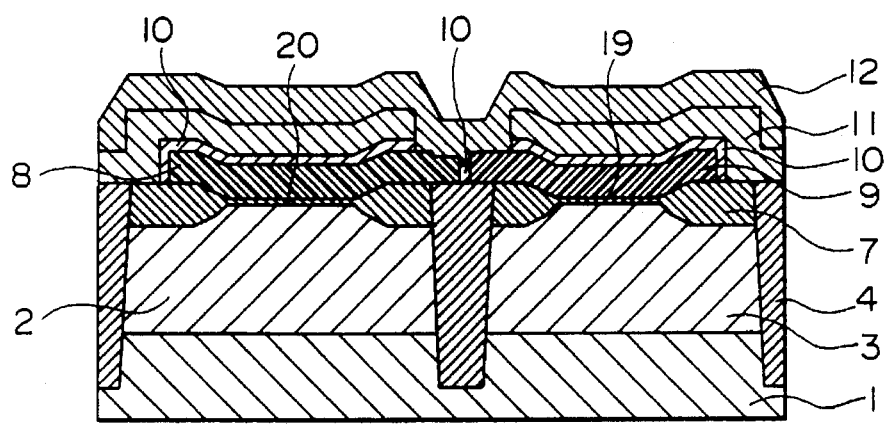
FIG. 26 is a cross-sectional view during the process wherein the resist (13) is eliminated after the opening of the contact holes is completed, and a first metal layer for wiring (12) is formed on the entire surface.
Figure 27:
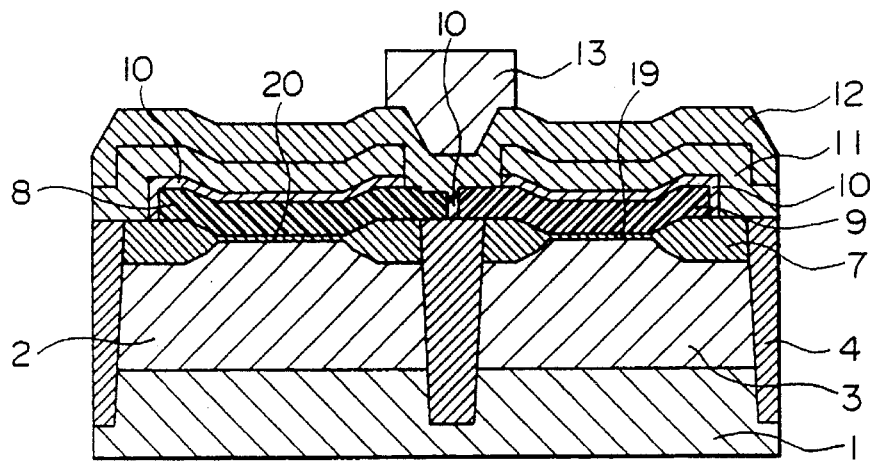
FIG. 27 is a cross-sectional view during the process wherein the wiring pattern for the resist (13) is formed by means of a lithographic technique.

Then, the interlayer insulation film (11) is etched by means of the resist (13) as the mask so that the contact holes are formed (see FIG. 25). The contact holes on the gate electrode open on the boundary of the phosphorus-doped polysilicon (9) and the boron-doped polysilicon (8), and enable the gate polysilicons (8 and 9) contact each other via each hole by means of subsequent wiring process.

Then, the resist (13) is eliminated after the opening of the contact holes is completed, a first metal layer for wiring (12) is formed on the entire surface (see FIG. 26), wiring pattern for the resist (13) is formed by means of a lithographic technique (FIG. 27), and, continuously, wiring metal layer (12) is etched by means of the formed resist pattern (13) as the mask, so that the first metal layer (12) for wiring is formed (see FIG. 1).

FIFTH EMBODIMENT

Next, the fifth embodiment of the present invention, concerning another method for fabricating semiconductor devices shown in FIG. 1, will be described, reference being made to FIGS. 28 to 35. This embodiment partially adopts the same processes as the fourth embodiment from the beginning until the process shown in FIG. 5, so that the phosphorus-doped polysilicon (9) is deposited on the entire surface.

Figure 28:
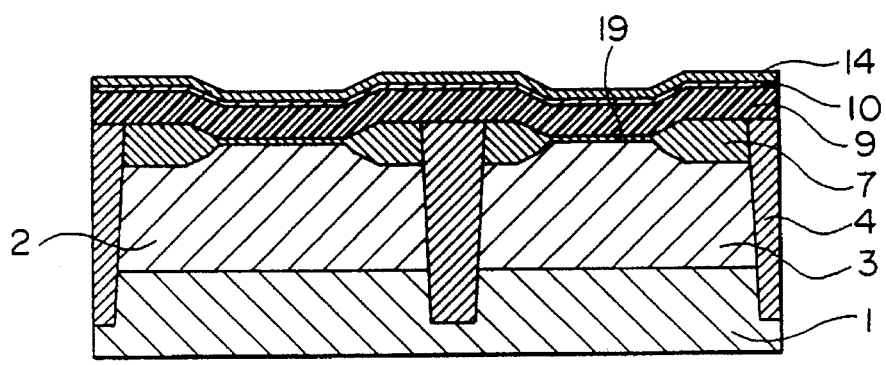
FIG. 28 is a cross-sectional view during the process wherein oxide film (10) is formed by means of thinly oxidizing the surface of the phosphorus-doped polysilicon (9) after the process in FIG. 5 is completed, and a nitride film (14) is further deposited on the entire surface.
Figure 29:
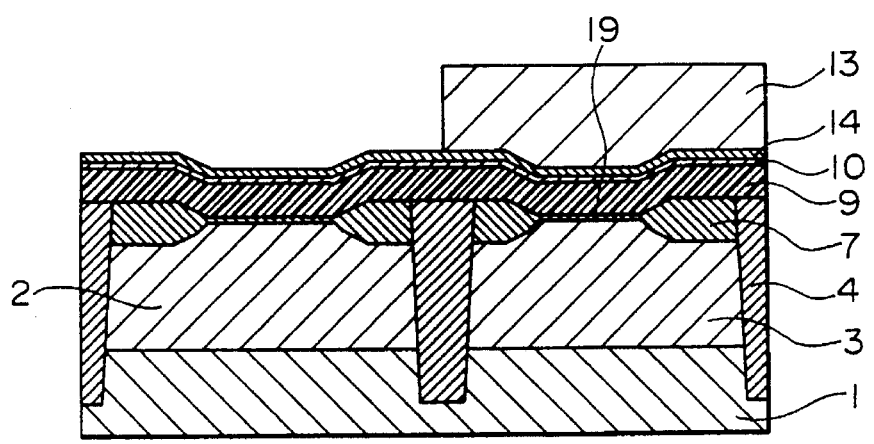
FIG. 29 is a cross-sectional view during the process wherein an etching mask by the resist (13) is formed on the N-channel MISFET region by means of a lithographic technique.
Figure 30:
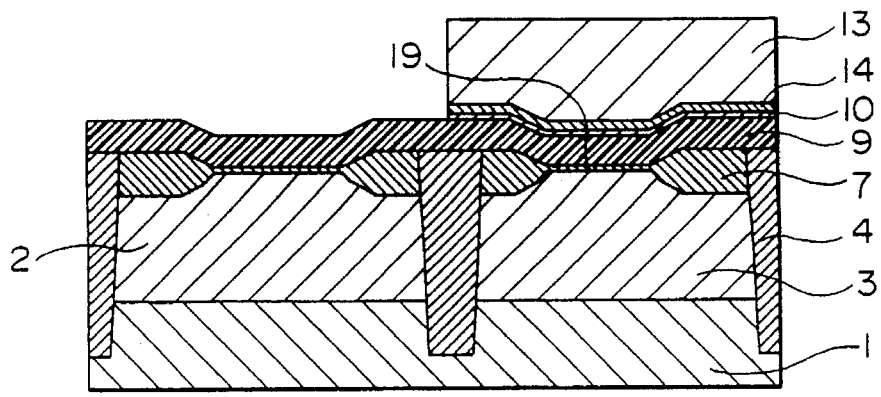
FIG. 30 is a cross-sectional view during the process wherein a nitride film (14) and a thin oxide film (10) are etched by means of resist 13 as the mask.
Figure 31:
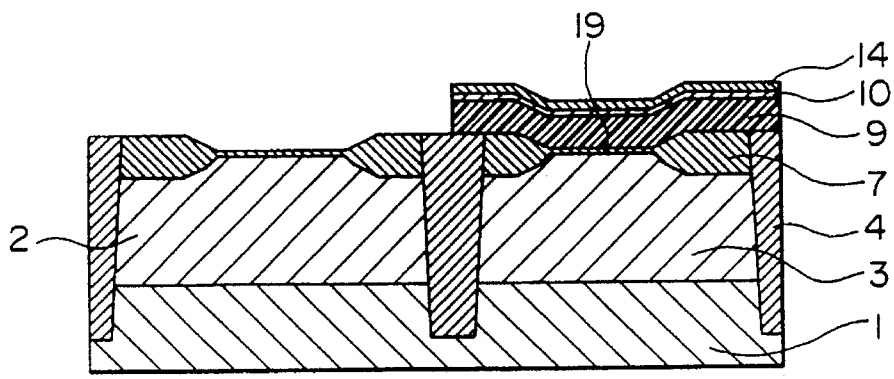
FIG. 31 is a cross-sectional view during the process wherein the phosphorus-doped polysilicon (9) is etched and eliminated by means of nitride film (14) as an etching mask after the resist (13) is eliminated.
Figure 32:
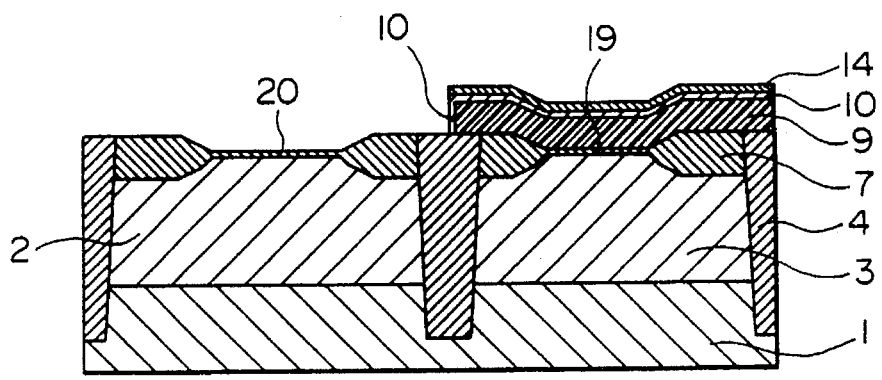
FIG. 32 is a cross-sectional view during the process wherein the previously oxidized oxide film (19) is eliminated when gate oxide film forming of the N-channel MISFET is executed, then, gate oxidation for the P-channel MISFET is executed so as to form the oxide film (20), side wall of the previously deposited phosphorus-doped polysilicon (9) for the gate electrode of the N-channel MISFET is oxidized simultaneously, and, continuously, a narrow region is formed at the boundary, between the boron-doped polysilicon (8) to be deposited for gate electrode of the P-channel MISFET and the polysilicon (9), so as to prevent diffusion of the impurities to the opposing polysilicons.

However, according to the fifth embodiment, the oxide film (10) is then formed by means of thinly oxidizing the surface of the phosphorus-doped polysilicon (9), and the nitride film (14) is further deposited on the entire surface (see FIG. 28). Then, an etching mask (13) is formed on the N-channel MISFET region by means of a lithographic technique (see FIG. 29); the nitride film (14) and the thin oxide film (10) are etched by means of resist 13 as the mask (see FIG. 30); and the unnecessary phosphorus-doped polysilicon (9) is etched and eliminated by means of nitride film (14) as an etching mask, and by a dry etching technique, ECR ion stream etching method for example, having a high etching rate of polysilicon on the oxide film (see FIG. 31).

Then, the previously oxidized oxide film (19) is eliminated when the gate oxide film formation the N-channel MISFET is executed, and gate oxidation of the P-channel MISFET is executed so as to form the oxide film (20). There is no need to coincide the film thickness of gate oxide film (20) and that of gate oxide film (19) for the N-channel MISFET. Therefore, the thicknesses can differ if necessary. Then, the side wall of the previously deposited phosphorus-doped polysilicon (9) for the gate electrode of the N-Channel MISFET is oxidized simultaneously, and, continuously, a narrow region is formed at the boundary, located between the boron-doped polysilicon (8) to be deposited for gate electrode of the P-channel MISFET and the polysilicon (9), so as to prevent diffusion of the impurities to the opposing polysilicons (see FIG. 32).

Figure 33:
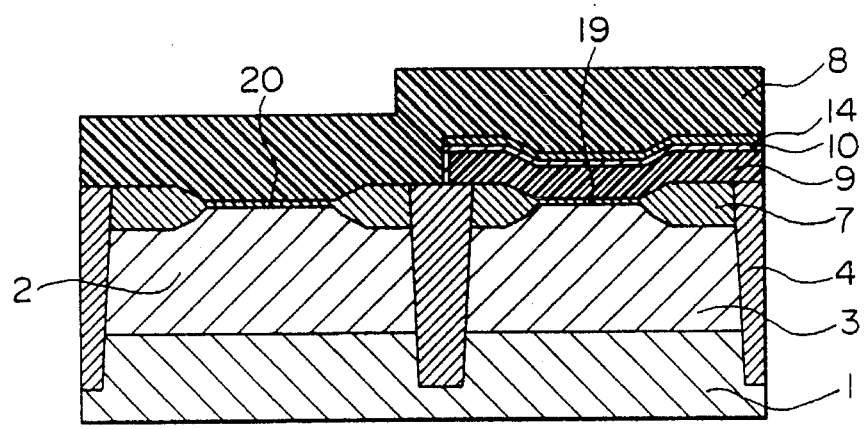
FIG. 33 is a cross-sectional view during the process wherein gate oxidation of P-channel MISFET is executed, channel doping for P-channel MISFET is executed if necessary, boron-doped polysilicon (8), namely, the gate electrode material for the P-channel MISFET is deposited rather ticker than the phosphorus-doped polysilicon (9)

After the gate oxidation of P-channel MISFET is completed, channel doping of P-channel MISFET is further executed, if necessary, so that the boron-doped polysilicon (8), that is, the gate electrode material for the P-channel MISFET, is deposited rather ticker than the phosphorus-doped polysilicon (9) (see FIG. 33).

Figure 34:
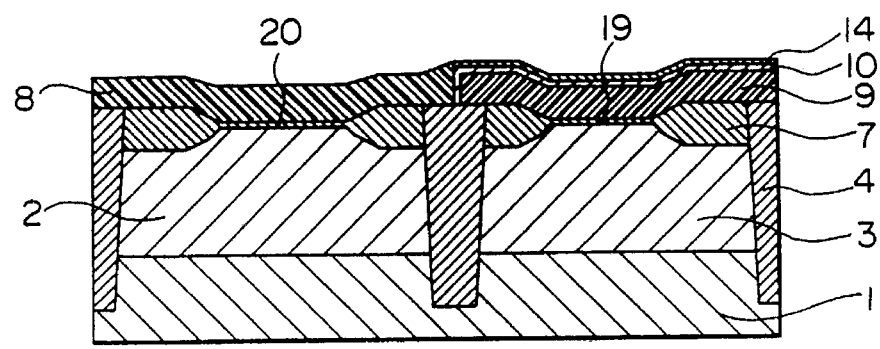
FIG. 34 is a cross-sectional view during the process wherein boron-doped polysilicon (8) is polished by means of a chemical mechanical polishing method and of the nitride film (14) on the phosphorus-doped polysilicon (9) as an etching stopper.
Figure 35:
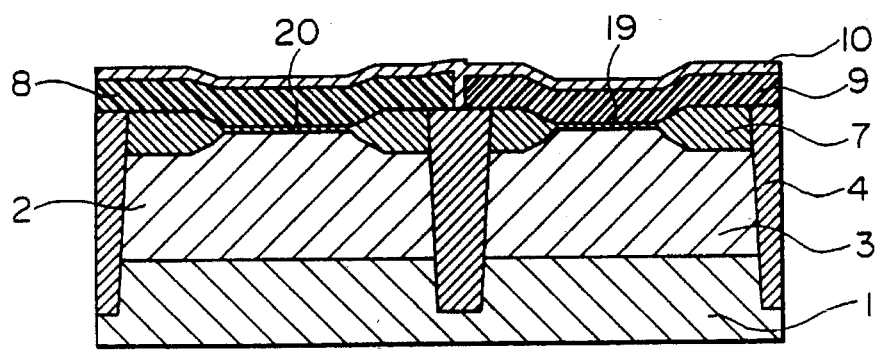
FIG. 35 is a cross-sectional view during the process wherein nitride film (14) is eliminated by hot phosphoric acid, oxidation is executed, and a thin oxide film (10) is formed on the entire surface.

Then, the wafer is polished by means of chemical mechanical polishing method and the nitride film (14) on the phosphorus-doped polysilicon (9) as an etching stopper so as to polish the boron-doped polysilicon (8) (see FIG. 34). Then, the nitride film (14) is eliminated by hot phosphoric acid; oxidation is executed; and a thin oxide film (10) is formed on the entire surface(see FIG. 35). The succeeding processes thereafter are as similar to those in the fourth embodiment shown in FIG. 14 and succeeding drawings.

SIXTH EMBODIMENT

Next, the sixth embodiment of the present invention, concerning a method for fabricating semiconductor devices shown in FIG. 2, will be described, reference being made to FIGS. 36 to 43. This embodiment, preferably adopted in cases where further low gate electrode resistance is required compared with that in FIG. 1, realizes the structure shown in FIG. 2 by means of the following processes.

Figure 36:
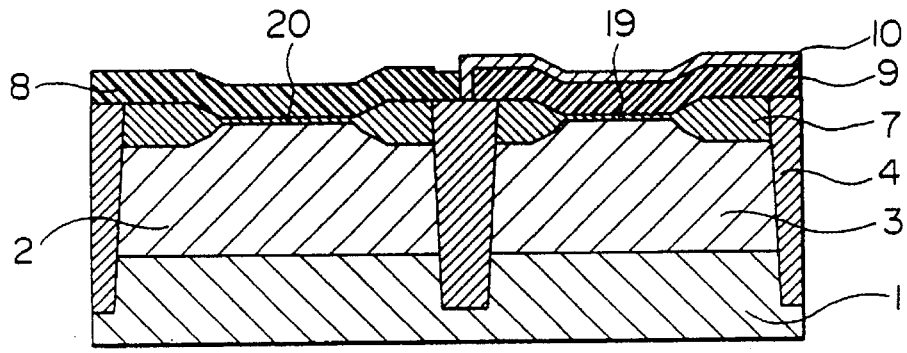
FIG. 36 is a cross-sectional view during the process wherein when to process of FIG. 13 is completed and resist (13) is eliminated, and during another process wherein the process of FIG. 34 is completed and the nitride film (14) is eliminated.
Figure 37:
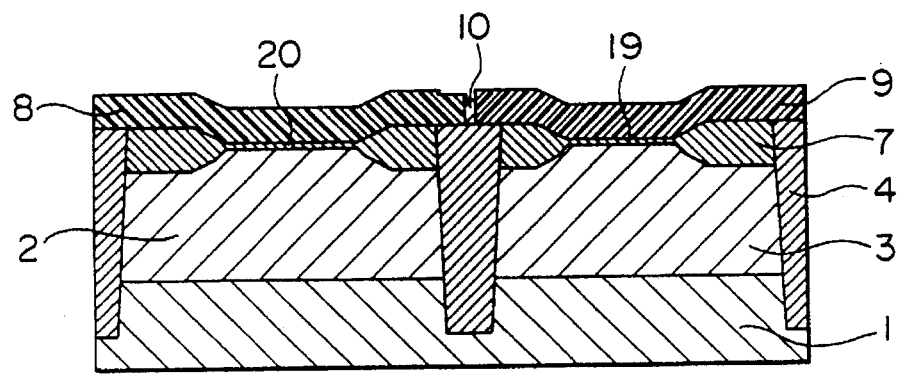
FIG. 37 is a cross-sectional view during the process wherein oxide film (10) on the phosphorus-doped polysilicon (9) is eliminated.
Figure 38:
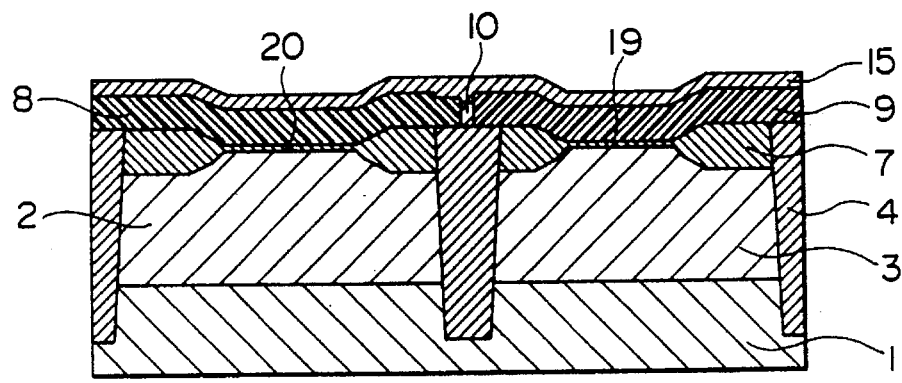
FIG. 38 is a cross-sectional view during the process wherein the silicide layer or refractory metal layer (15) is formed on the entire surface.
Figure 39:
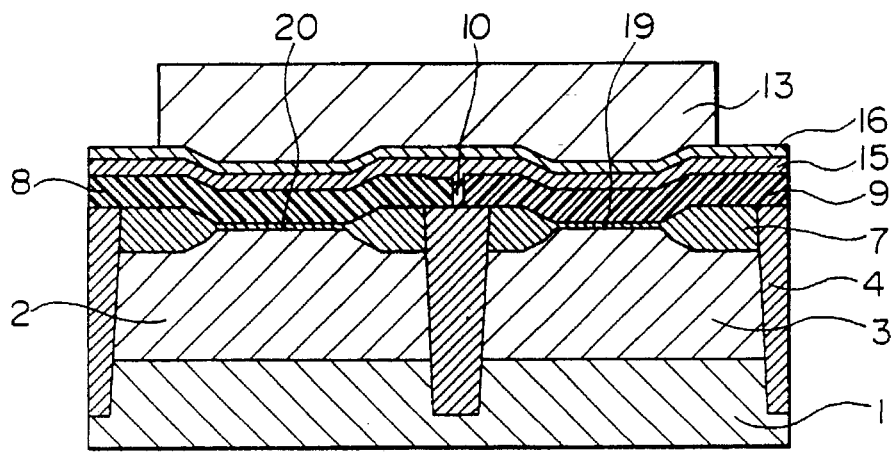
FIG. 39 is a cross-sectional view during the process wherein thin insulator layer (16) is formed by means of a CVD method, resist (13) is coated, and the gate electrode pattern is formed by means of a lithographic technique.
Figure 40:
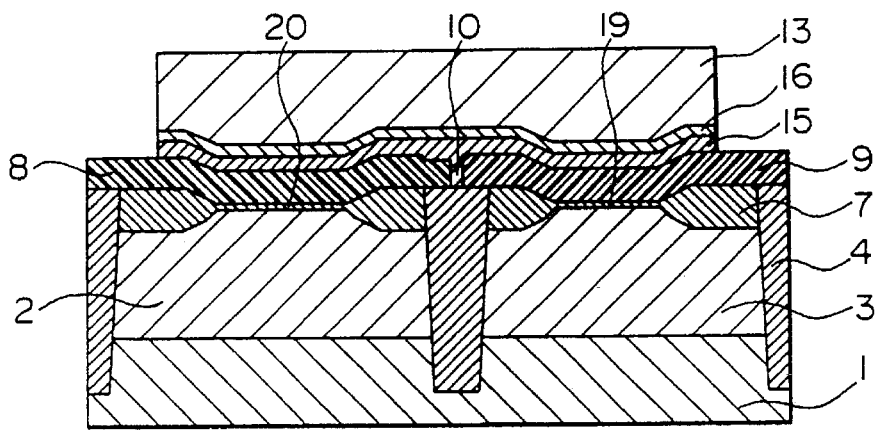
FIG. 40 is a cross-sectional view during the process wherein thin insulator layer (16) and the silicide layer or the refractory metal layer (15) are etched by means of resist (13) as the mask.

First of all, processes are executed until the resist (13) is eliminated from the structure shown in FIG. 13 concerning the fourth embodiment, or until the nitride film (14) is eliminated from the structure shown in FIG. 34 concerning the fifth embodiment (see FIG. 36). Then, the oxide film (10) on, the phosphorus-doped polysilicon (9) is eliminated (see FIG. 37). The elimination method can be embodied either by dry etching or wet etching by hydrofluoric-acid-based solutions. Then, the silicide layer or refractory metal layer (15) is formed on the entire surface (see FIG. 38). Furthermore, a thin insulator layer (16) is formed by means of a CVD method, resist (13) is coated, and the gate electrode pattern is formed by means of a lithographic technique (see FIG. 39). Then, the thin insulator layer (16) and the silicide layer or refractory metal layer (15) are etched using resist (13) as the mask (see FIG. 40). If a sufficient selectivity can be obtained, the silicide layer or refractory metal layer (15) can be etched by only using the resist as the etching mask.

Figure 41:
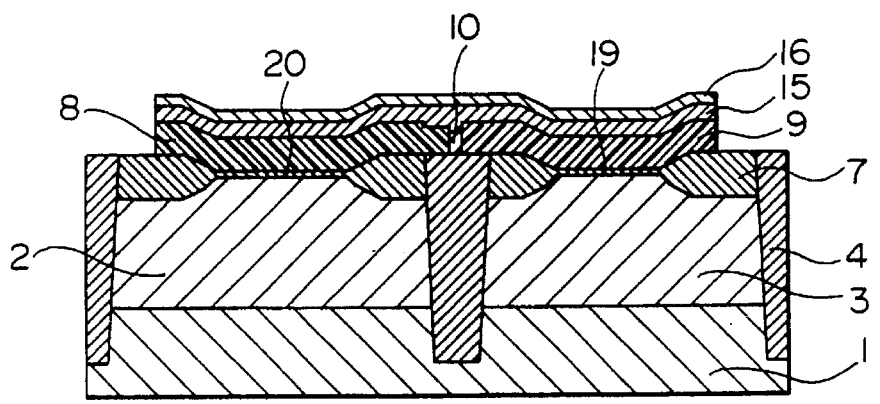
FIG. 41 is a cross-sectional view during the process wherein polysilicon layers (8 and 9) are etched by means of previously etched thin insulator layer (16) and of silicide layer or refractory metal layer (15) as the masks.
Figure 42:
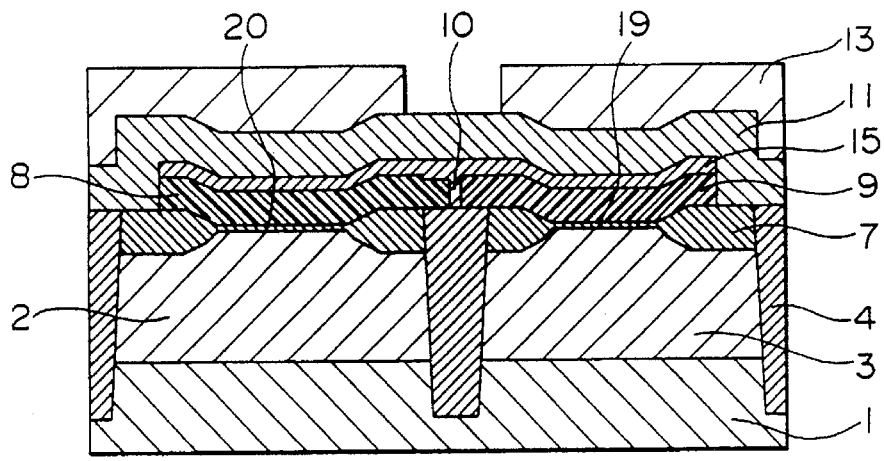
FIG. 42 is a cross-sectional view during the process wherein interlayer insulation film (11) is sequentially deposited on the entire surface, resist (13) is coated on the film (11), and contact hole patterns are formed by means of a lithographic technique.
Figure 43:
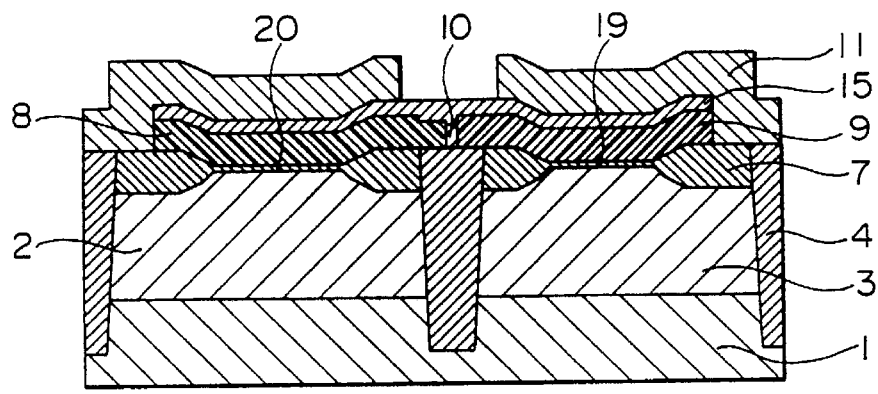
FIG. 43 is a cross-sectional view during the process wherein interlayer insulation film (11) is etched and eliminated by means of masking the pattern of previously formed resist (13), and the contact hole is formed.

Then, polysilicon layers (8 and 9) are etched by means of previously etched thin insulator layer (16) and of silicide layer or refractory metal layer (15) as the masks (see FIG. 41). Then, interlayer insulation film (11) is sequentially deposited on the entire surface, resist (13) is further coated on the film (11), and tile contact hole pattern is formed by means of a lithographic technique (see FIG. 42). Then, the interlayer insulation film (11) is etched and eliminated by means of masking the pattern of previously formed resist (13), and the contact hole is formed (see FIG. 43). The succeeding processes thereafter are similar to those in the fourth embodiment shown in FIG. 25 and subsequent drawings. The first metal electrode for wiring (12) is formed so that the structure shown in FIG. 2 is obtained.

SEVENTH EMBODIMENT

Next, the seventh embodiment of the present invention, concerning another method for fabricating semiconductor devices shown in FIG. 2, will be described, reference being made to FIGS. 44 to 47. This embodiment is preferably adopted in cases where a further low gate electrode resistance, compared with that in FIG. 1, is required, as similar to the second and sixth embodiments, and realizes the structure shown in FIG. 2 by means of the following processes.

Figure 44:
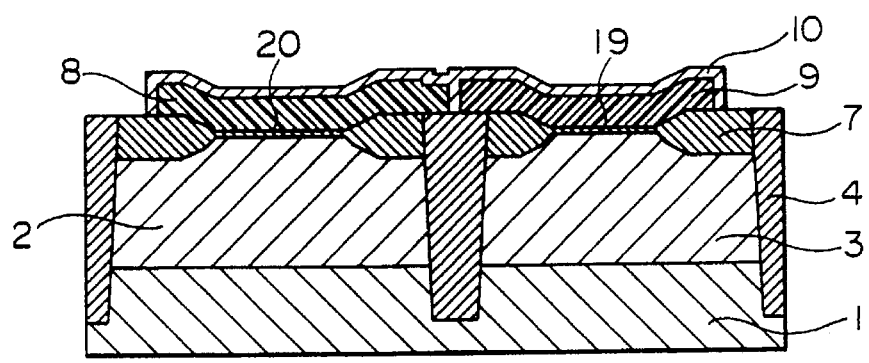
FIG. 44 is a cross-sectional view wherein processses are executed until the conditions shown in FIG. 23 are obtained.
Figure 45:
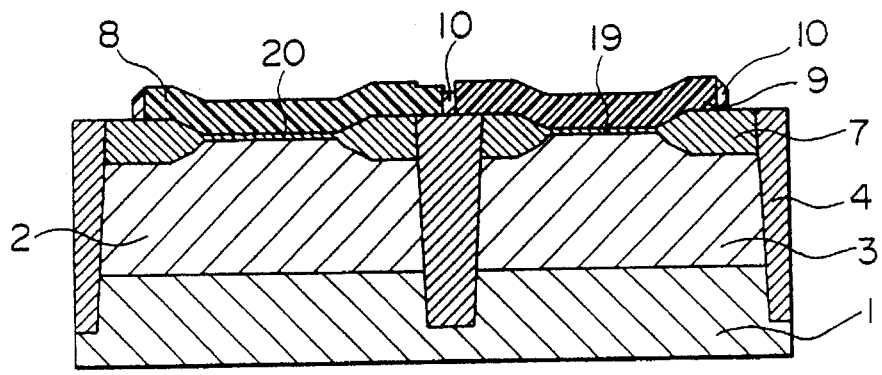
FIG. 45 is a cross-sectional view during the process wherein only the oxide film (10) on the polysilicons (8 and 9) is eliminated by means of anisotropic etching.
Figure 46:
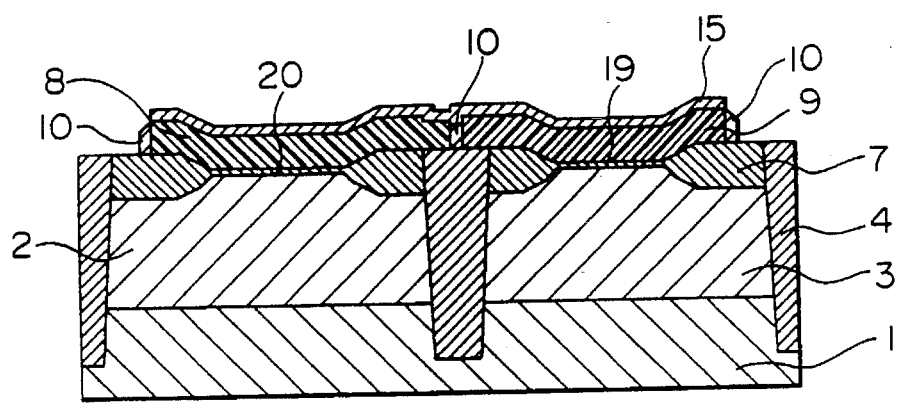
FIG. 46 is a cross-sectional view during the process wherein the silicide layer or refractory metal layer (15) is selectively formed on the exposed gate polysilicons (8 and 9)
Figure 47:
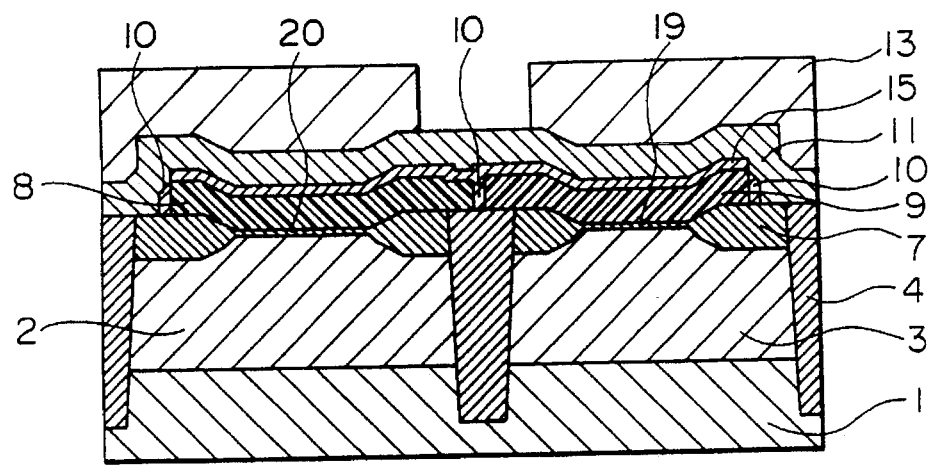
FIG. 47 is a cross-sectional view during the process wherein interlayer insulation film (11) is sequentially deposited over the entire surface, resist (13) is further coated on the film (11), and contact hole patterns are formed by means of a lithographic technique.
Figure 48:
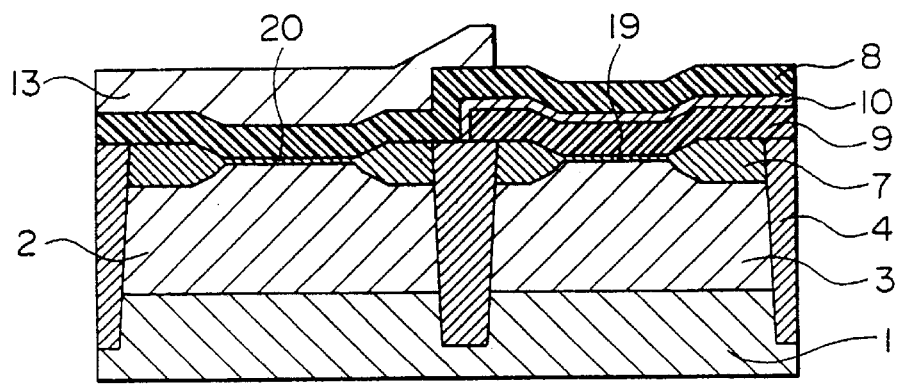
FIG. 48 is a cross-sectional view during the process wherein when the process of FIG. 9 is completed, the resist (13) is coated over the entire surface and resist (13), having a region which is larger than the P-channel MISFET region, remains by means of a lithographic technique.
Figure 49:
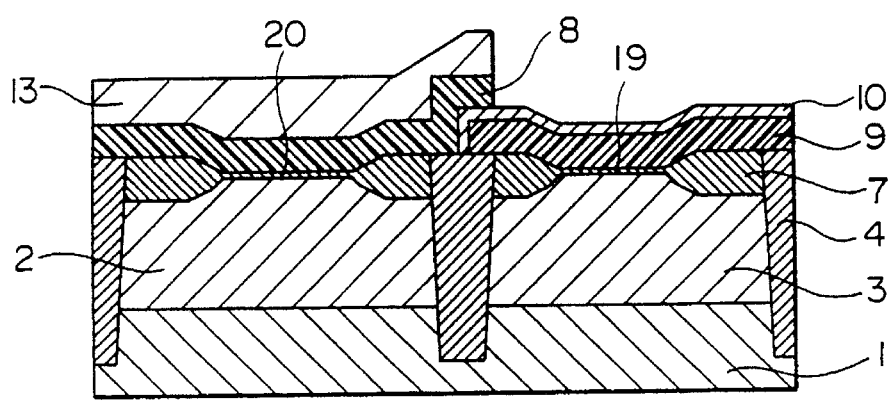
FIG. 49 is a cross-sectional view during the process wherein the exposed boron-doped polysilicon (8) is etched, and the thin oxide film (10) covering the surface of phosphorus-doped polysilicon (9) acts as the stopper.
Figure 50:
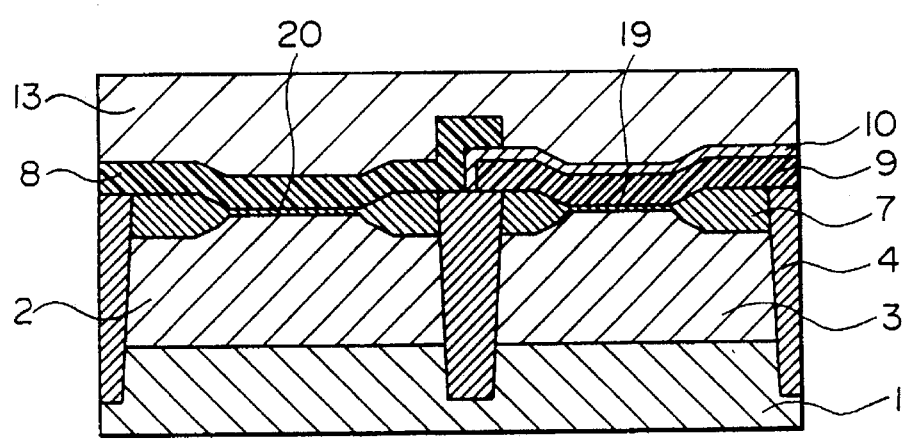
FIG. 50 is a cross-sectional view during the process wherein resist (13) is eliminated by means of an $O_2$ plasma asher or other methods, and the entire surface is again covered with the resist (13)
Figure 51:
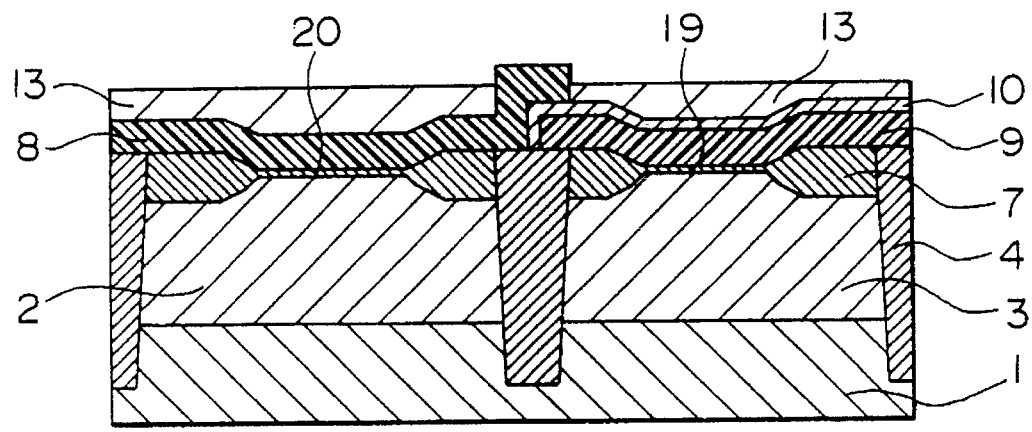
FIG. 51 is a cross-sectional view during the process wherein entire etch back of resist (13) is executed, and, accordingly, a protruding region, in which the electrode of the N-type doped polysilicon (9) is overlapped with a portion of the electrode of P-type doped polysilicon (8), is exposed.
Figure 52:
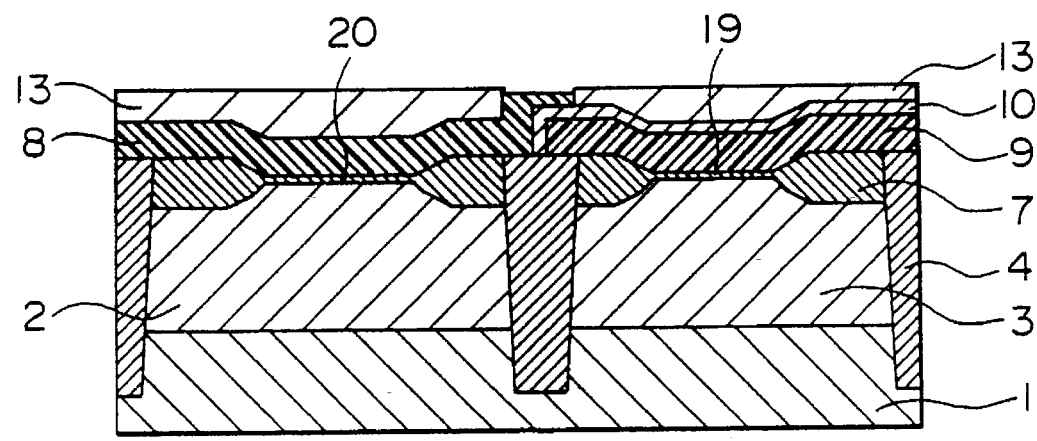
FIG. 52 is a cross-sectional view during the process wherein the exposed region is appropriately etched, and the thickness of exposed portion of polysilicon (8) is reduced.

First of all, processes are executed until the condition in FIG. 23 is obtained as similar to the fourth and fifth embodiments (see FIG. 44). Then, only the oxide film (10) on the polysilicons (8 and 9) is eliminated by means of anisotropic etching (see FIG. 45); the silicide layer or refractory metal layer (15) is selectively formed on the exposed gate polysilicons (8 and 9) (see FIG. 46); interlayer insulation film (11) is sequentially deposited on the entire surface; resist (13) is further coated on the film (11), and contact hole patterns are formed by means of a lithographic technique (see FIG. 47). The succeeding processes thereafter are as similar to those in sixth embodiment shown in FIG. 42 and forth drawings. The first metal electrode for wiring (12) is formed so that the structure shown in FIG. 2 is obtained.

EIGHTH EMBODIMENT

Next, the eighth embodiment of the present invention, concerning a method for fabricating semiconductor devices shown in FIG. 3, will be described reference being made to FIGS. 48 to 63. The structure wherein a portion of the electrode of P-type doped polysilicon (8) is laid on the electrode of the N-type doped polysilicon (9) is obtained as follows.

First of all, processes are executed until the condition in FIG. 9 obtained is similar to that of the fourth embodiment. Then, the resist (13) is coated over the entire surface; and resist (13), having a rather wide region compared with the P-channel MISFET region, remains by means of a lithographic technique (see FIG. 48). Then, the exposed boron-doped polysilicon (8) is etched by means of the dry etching technique, the ECR ion stream etching method for example having a high etching rate of polysilicon to the oxide film. Then, the etching is stopped when the thin oxide film (10) on the phosphorus-doped polysilicon (9) is exposed. In this case, the thin oxide film (10), covering the surface of phosphorus-doped polysilicon (9), acts as the stopper (see FIG. 49). Then, the resist (13) is eliminated by means of an $O_2$ plasma asher or other methods, and the entire surface is again coated with the resist (13) (see FIG. 50). The region where the electrode of N-type doped polysilicon (9) is layered by a portion of the electrode of P-type doped polysilicon (8) is a protruding narrow region, so that the thickness of the resist (13) on the protruding region is made thinner than the other regions. Then, the entire etch-back of resist (13) is executed so as to expose the protruding region, in which the electrode of the N-type doped polysilicon (9) is overlapped with a portion of the electrode of the P-type doped polysilicon (8) (see FIG. 51). Then, the exposed region is appropriately etched, and the thickness of the exposed portion of polysilicon (8) is made thinner (see FIG. 52).

Figure 53:
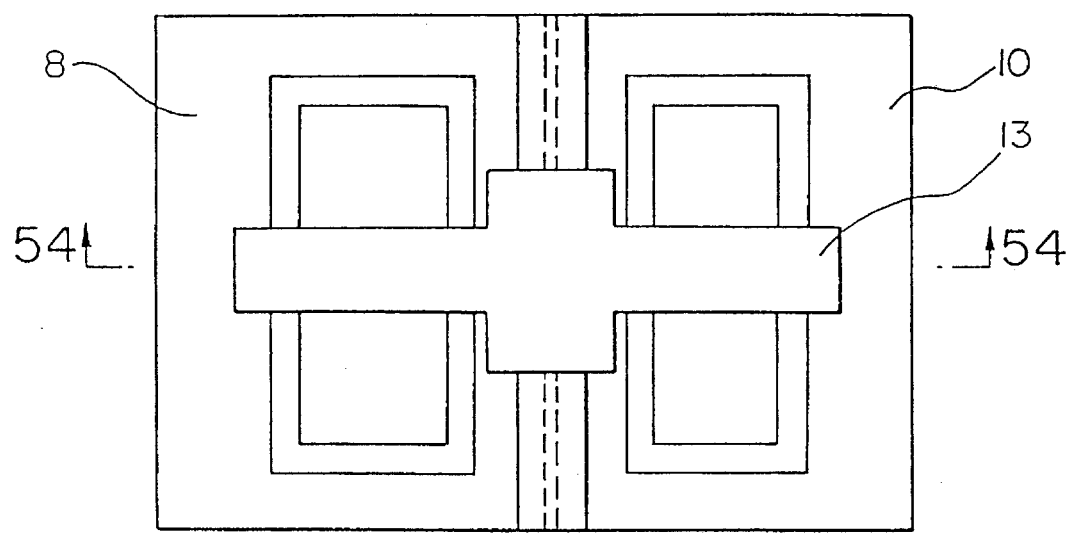
FIG. 53 is a schematic top view during the process wherein resist (13) is eliminated, and the resist pattern of gate electrodes is formed by means of a lithographic technique.
Figure 54:
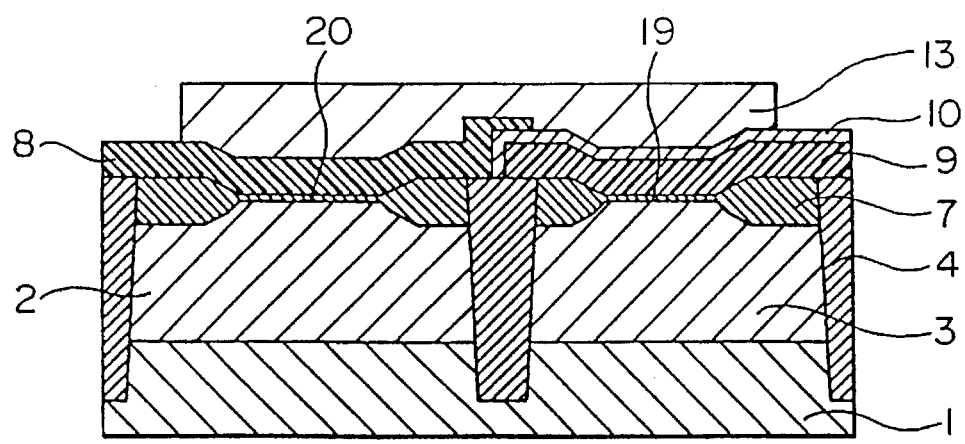
FIG. 54 is a schematic cross-sectional view in the 54—54 section of FIG. 53.
Figure 55:
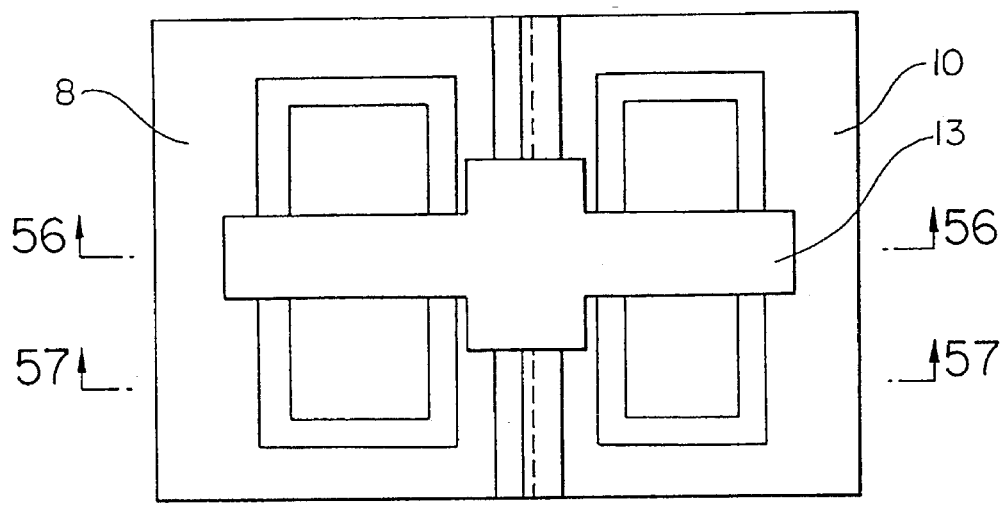
FIG. 55 is a schematic top view during the process wherein the oxide film is etched until the P-type doped polysilicon (8), formed on the region excluding the region of the gate pattern on the N-type doped polysilicon electrode (9), is eliminated by means of a lithographic technique and a dry-etching technique, etc., having a high polysilicon etching rate.
Figure 56:
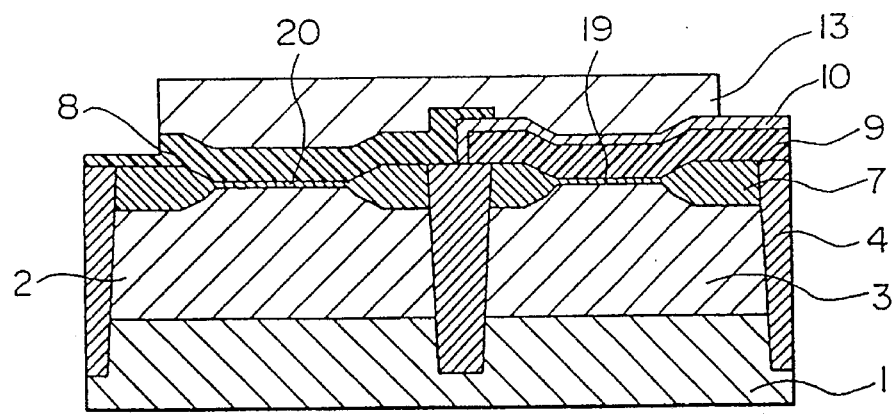
FIG. 56 is a schematic cross-sectional view in the 56—56 section of FIG. 55.
Figure 57:
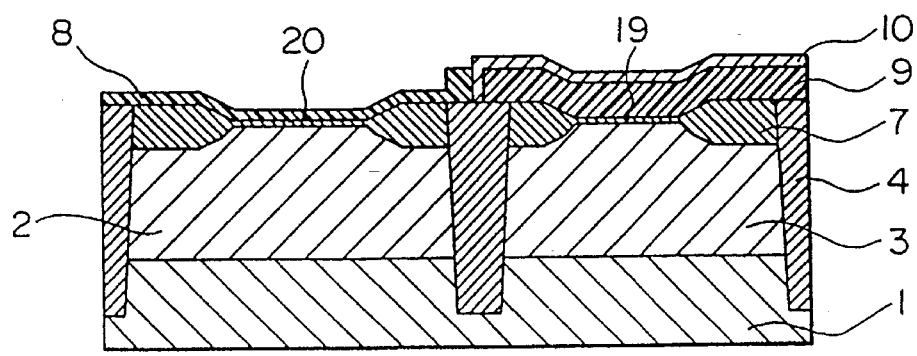
FIG. 57 is a schematic cross-sectional view in the 57—57 section of FIG. 55.
Figure 58:
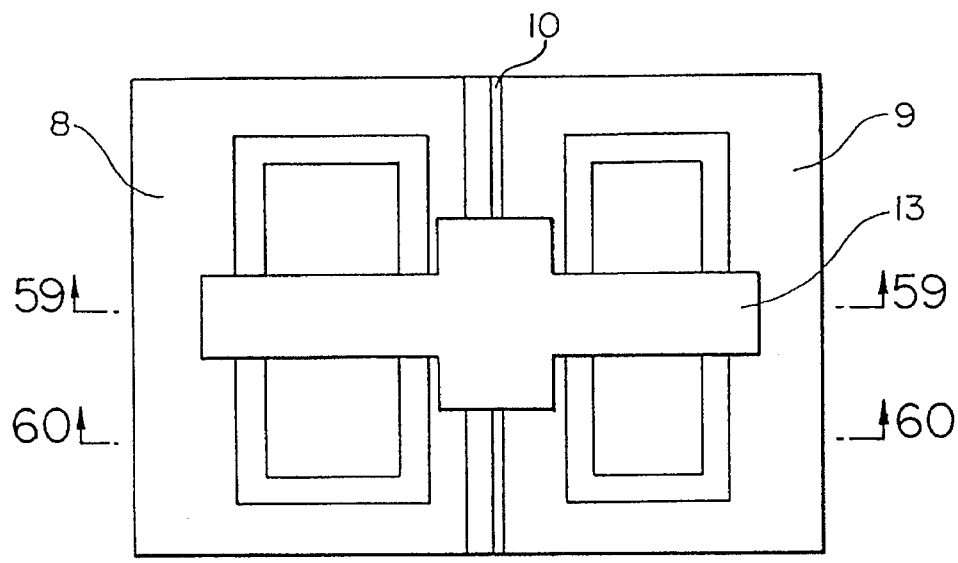
FIG. 58 is a schematic top view during the process wherein thin oxide film (10) on the N-type polysilicon (9), the region thereof excluding the region of the gate pattern being exposed, is eliminated by means of etching.
Figure 59:
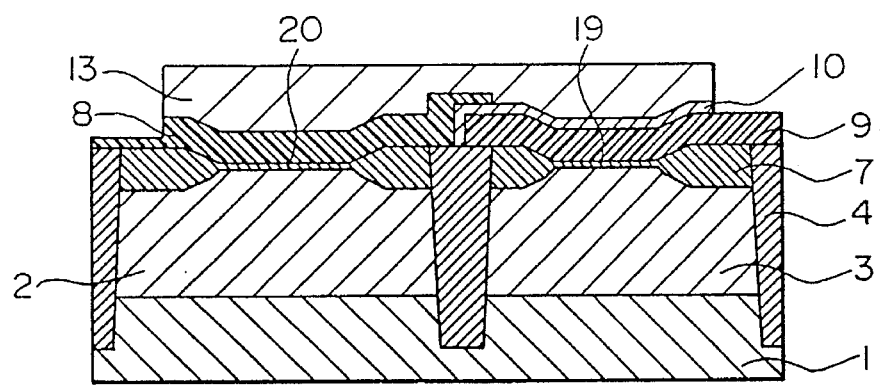
FIG. 59 is a schematic cross-sectional view in the 59—59 section FIG. 58.
Figure 60:
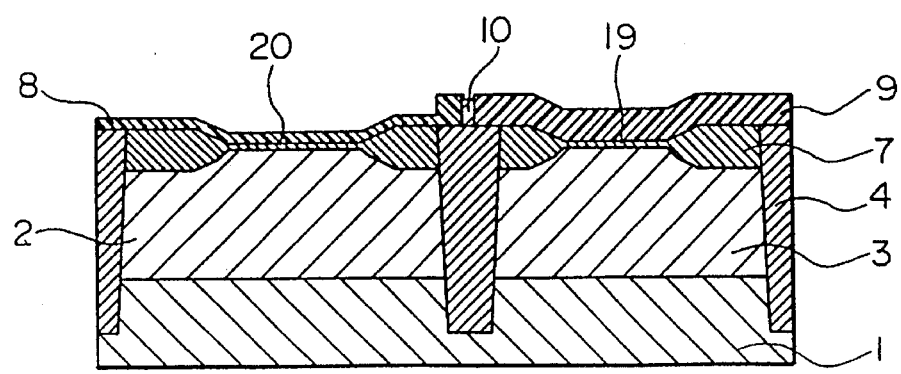
FIG 60 is a schematic cross-sectional view in the 60—60 section of FIG. 58.

Then, the resist (13) is eliminated, and the resist pattern of gate electrodes is formed by means of a lithographic technique (see FIGS. 53 and 54). Incidentally, FIG. 54 is a schematic cross-sectional view in the 54—54 section of FIG. 53. Then, the oxide film is etched until the P-type doped polysilicon (8), formed on the region except for the gate pattern on the N-type doped polysilicon electrode (9), is eliminated by means of a lithographic technique and a dry etching technique, for example, the ECR ion stream etching method, etc., having a high etching rate of polysilicon (see FIGS. 55 to 57). FIG. 56 is a schematic cross-sectional view in 56—56 section of FIG. 55; and FIG. 57 is a schematic cross-sectional view in 57—57 section of FIG. 55. Then, the thin oxide film (10) on the N-type polysilicon (9), the region thereof is exposed except for the gate pattern, is eliminated by means of etching (see FIGS. 58 to 60). FIG. 59 is a schematic cross-sectional view in the 59—59 section of FIG. 58; and FIG. 60 is a schematic cross-sectional view in the 60—60 section of FIG. 58.

Figure 61:
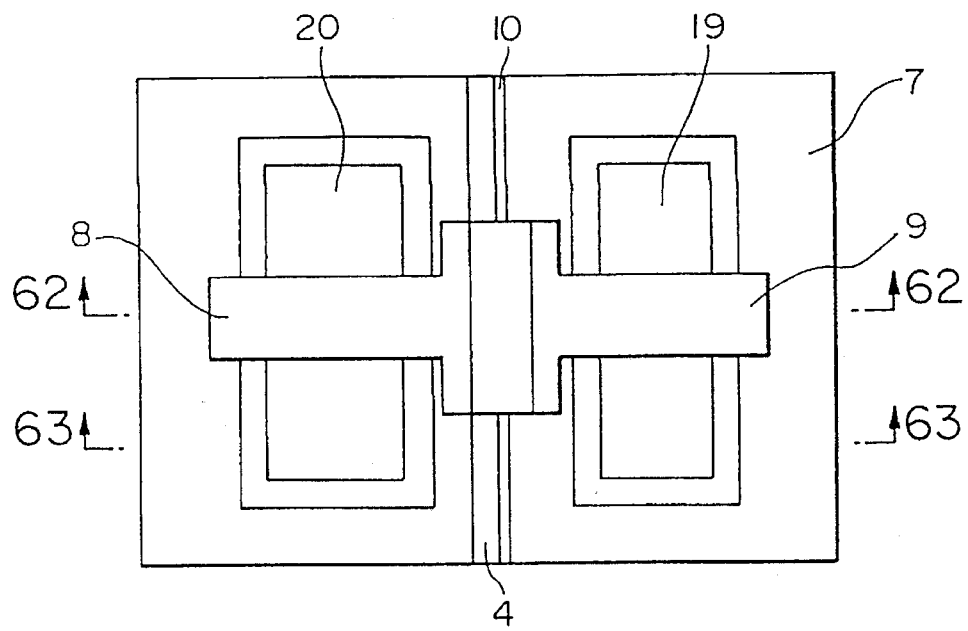
FIG. 61 is a schematic top view during the process wherein polysilicons (8 and 9) are continuously etched, resist (13) is eliminated when the etching is completed, and the gate pattern is formed.
Figure 62:
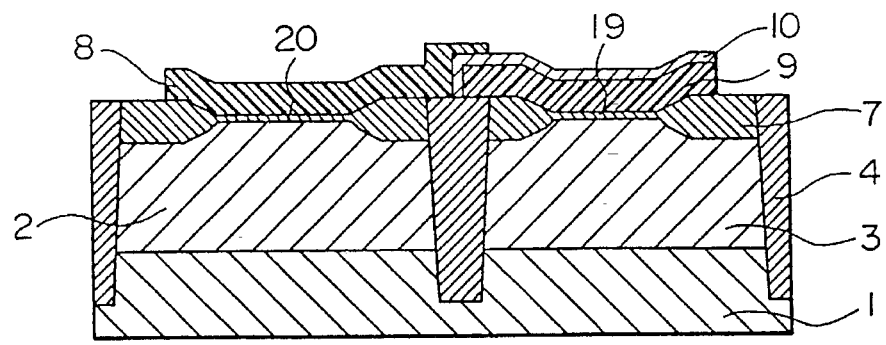
FIG. 62 is a schematic cross-sectional view in the 62—62 section of FIG. 61.
Figure 63:
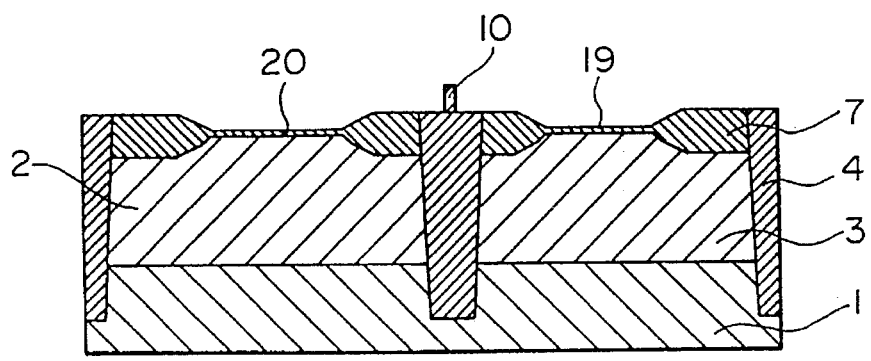
FIG. 63 is a schematic cross-sectional view in the 63—63 section of FIG. 61.
Figure 64:
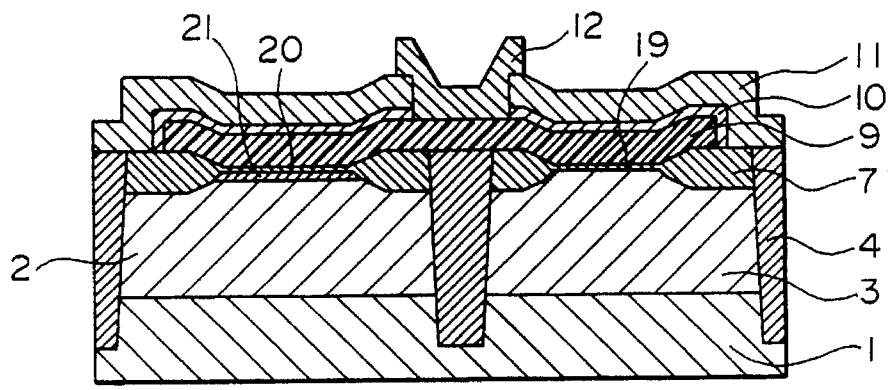
FIG. 64 is a schematic cross-sectional view during a conventional fabrication process of complementary-type MISFET wherein polysilicon having the same configuration with that of the N-channel MISFET is adopted as the gate electrode for the P-channel MISFET having a buried channel type structure.
Figure 65:
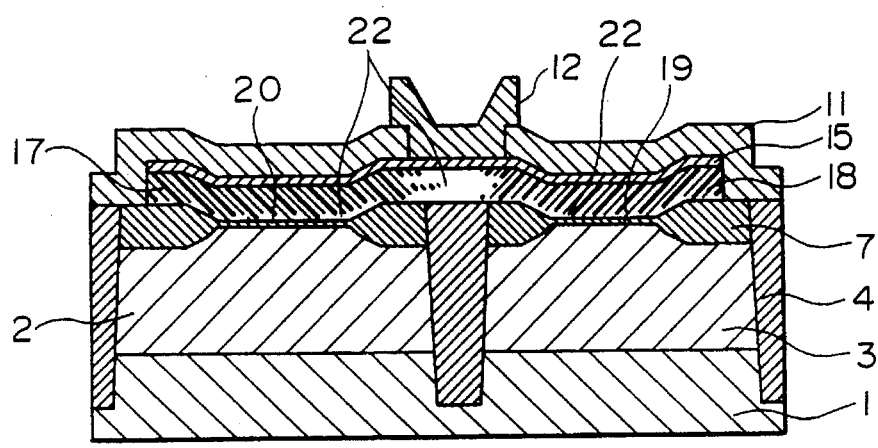
FIG. 65 is a schematic cross-sectional view during a conventional fabrication process of a dual $N^+/P^+$ polysilicon gate and complementary-type MISFET wherein the polysilicon gate electrodes of the P- and N-channel MISFETs are doped with impurities by means of ion implantation.

Then, polysilicons (8 and 9) are continuously etched, resist (13) is eliminated when the etching is completed, and the gate pattern is formed (see FIGS. 61 to 63). Incidentally, FIG. 62 is a schematic cross-sectional view in the 62—62 section of FIG. 61; and FIG. 63 is a schematic cross-sectional view in the 63—63 section of FIG. 61. Then, the thin oxide film (10), which remains on the region, except for the gate pattern, as a wall, is eliminated in a manner similar to the process shown in FIG. 17 concerning the fourth embodiment. The succeeding processes thereafter are similar to those in the fourth embodiment shown in FIG. 21 and succeeding drawings. However, the contact hole to be opened will be biased to the position where both the N-type doped polysilicon electrode (9) and P-type doped polysilicon electrode (8) are exposed to the contact hole. When the contact holes are formed, a metal electrode for Wiring pattern (12) is also formed, so that the target structure, shown in FIG. 3 and concerning the third embodiment, can be obtained.

According to the eighth embodiment, the metal film (15) can be formed on the gate polysilicons (8 and 9), in a manner similar to those of the sixth and seventh embodiments. If such a metal layer (15) is formed, the restriction concerning the contact hole opening position can be eliminated.

NINTH EMBODIMENT

Next, the ninth embodiment of the present invention will be described, reference being made to FIG. 66. FIG. 66 shows an example wherein a film made of polysilicon, a stacked layered film consisting of a polysilicon layer and another polysilicon layer enriched with tungsten, another stacked film containing a polysilicon film enriched with nitrogen as the bottom layer, or other stacked films combined with two of the above stacked films, are utilized as the gate electrode.

In FIG. 66, the numeral 1 designates a low impurity concentration silicon substrate, the numeral 2 designates an N-well region, the numeral 3 designates a P-well region, the numeral 4 designates an isolation region between the N-well and the P-well, the numeral 7 designates an insulator film for interdevice isolation. The numeral 8 designates a boron-doped polysilicon, a stacked layered film consisting of a polysilicon layer and another polysilicon layer enriched with tungsten another stacked film containing a polysilicon film enriched with nitrogen as the bottom layer, or other stacked films combined with two of above stacked films, are utilized as the gate electrode. The numeral 10 designates an oxide film containing an oxidized polysilicon, an oxidized stacked layered film consisting of a polysilicon layer and another polysilicon layer enriched with tungsten, another oxidized stacked film containing a polysilicon film enriched with nitrogen as the bottom layer, or other oxidized stacked films combined with two of the above stacked films. The numeral 11 designates an interlayer insulation film, the numeral 12 designates a metal electrode for wiring, contacted with gate electrode polysilicons (8 and 9).

Furthermore, the numerals 19 and 20 respectively designate gate oxide films utilized for the N- and P-channel MISFETs. The source and drain regions of N- and P-channel MISFETs are not located just below the gate, which are located on the region at the terminus of the gate electrodes and the region where the gate electrodes do not exist, and, therefore, are not shown in FIG. 66.

The embodiment in FIG. 66 is structurally characterized in the polysilicon doped with N- and P-type impurities, a stacked layered film consisting of the doped polysilicon layer and another polysilicon layer enriched with tungsten, another stacked film contains a polysilicon film enriched with nitrogen as the bottom layer, or other stacked films combined with two of the above stacked films are utilized as the different type gate electrode material in the complementary-type field-effect semiconductor devices. Furthermore, according to this embodiment of the present invention, diffusion of the impurities to the opposing polysilicons can be prevented, and no layering positional lag appears between the gate electrode patterns of the P-channel and the N-channel MISFETs compared with the designated relative position.

TENTH EMBODIMENT

Figure 7:
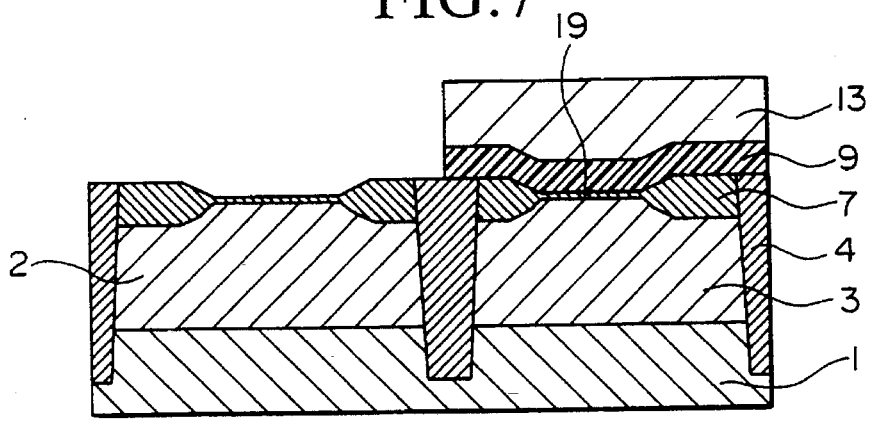
FIG. 7 is a cross-sectional view during the process of etching and eliminating only the unnecessary phosphorus-doped polysilicon (9) by means of mask (13)
Figure 8:
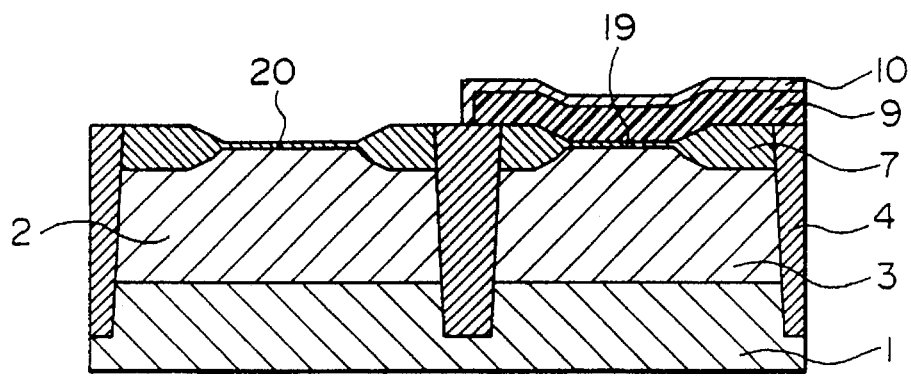
FIG. 8 is a cross-sectional view during the process wherein the used mask (13) is eliminated, oxidatively formed oxide film (19) is eliminated when gate oxide film forming of N-channel MISFET is executed, gate oxidation of P-channel MISFET is executed, and oxide film (10) is formed on the phosphorus-doped polysilicon (9) simultaneously with the forming of gate oxide film (20)

Next, the tenth embodiment of the present invention will be described. The tenth embodiment partially adopts a process similar to that of the fourth embodiment. That is, in the first place, the device region, the isolation regions (4 and 7), the P-well (3) and N-well (2) are formed on the silicon substrate 1 as shown in FIG. 4. Then, the phosphorus-doped polysilicon (9) is deposited as shown in FIG. 5. The etching mask (13) is formed continuously on the N-channel MISFET region as shown in FIG. 6, etching is executed as shown in FIG. 7, and the used mask (13) is eliminated. Then, the oxide film (19) is eliminated as shown in FIG. 8, the gate oxide film (20) and the oxide film (10) are formed, and the boron-doped polysilicon (8) is deposited as shown in FIG. 9.

Figure 11:
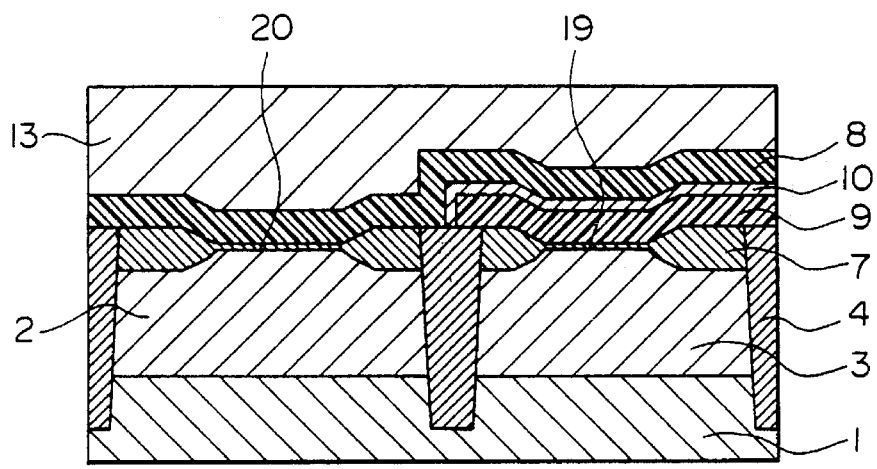
FIG. 11 is a cross-sectional view during the process wherein, when the above process in FIG. 10 is completed, the resist is coated and thereby resist layer (13) having a flat surface is formed.

The resist (13) is formed continuously as shown in FIG. 11, the entire surface is etch-back, the boron-doped polysilicon (8) formed on the phosphorus-doped polysilicon (9) is exposed (see FIG. 12), and the exposed boron-doped polysilicon (8) is etched (see FIG. 13).

According to the above processes, in a manner similar to those of the fourth embodiment, the deposition of gate electrode material for the P- and N-channel MISFETs is completed (see FIG. 14). Then, the following processes characterizing the tenth embodiment are executed.

That is, according to this embodiment, separated gate electrode patterns for N and P channels are formed by means of a lithographic technique, so that the mask for polysilicon etching is formed.

More specifically, in the first place, the thin oxide film (10) is formed on the polysilicon, a stacked layered film consisting of a polysilicon layer and another polysilicon layer enriched with tungsten, another stacked film containing a polysilicon film enriched with nitrogen as the bottom layer, or other stacked films (8 and 9) combined with two of the above stacked films, by means of thermal oxidation. Then, the resist (13) is coated on the thin oxide film (10); the gate pattern is formed by means of a lithographic technique (see FIG. 67); and the polysilicon, a stacked layered film consisting of a polysilicon layer and another polysilicon layer enriched with tungsten, another stacked film contains a polysilicon film enriched with nitrogen as the bottom layer, or other stacked films (8 and 9) combined with two of the above stacked films, is etched by means of the resist pattern (13) as the etching mask.

Figure 68:
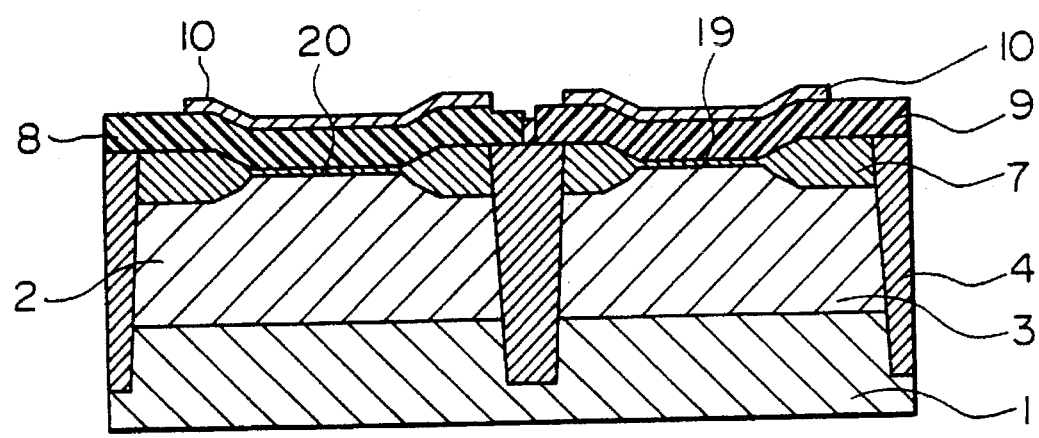
FIG. 68 is a cross-sectional view during the process wherein thin oxide film (10) on the polysilicons (8 and 9) is etched by means of resist pattern (13) as the etching mask, then resist (13) is eliminated, and, therefore, mask (10) is formed in order to etch the gate polysilicons (8 and 9).

Alternatively, another method can be adopted wherein the thin oxide film (10) on the polysilicon, the stacked layered film consisting of a polysilicon layer and another polysilicon layer enriched with tungsten, another stacked film containing a polysilicon film enriched with nitrogen as the bottom layer, or the other stacked films (8 and 9) combined with two of the above stacked films, is etched; the resist (13) is then eliminated; and the oxide film mask (10) may be formed in order to etch the polysilicon, the stacked layered film consisting of a polysilicon layer and another polysilicon layer enriched with tungsten, another stacked film containing a polysilicon film enriched with nitrogen as the bottom layer, or the other stacked films (8 and 9) combined with two of above stacked films (see FIG. 68).

The gate electrode is formed by the mask by either of the above methods; and the thin oxide film, remaining on the boundary region of N- and P-channel MISFETs as a wall in order to prevent the mutual diffusion of the doped impurity, is then eliminated by means of dilute hydrofluoric acid method, etc.

MODIFICATIONS

The preferred embodiments described heretofore are illustrative and not restrictive. Therefore, this invention may be practiced or embodied in still other ways without departing from the spirit or essential character thereof.

For example, according to the above embodiments, silicon oxide is filled in the thin insulation region between gate electrodes of the N and P channel MISFETs; however, the silicon oxide is no more than an example and may be replaceable by other materials.

Furthermore, according to the embodiments, in particular for the first to eighth embodiments, the polysilicon films for the gate electrodes are describes for clarify as being single layered films doped with impurities; however, there are other various known methods for forming polysilicon films. Therefore, such method can be also adopted in the present invention. For example, the stacked layered film consisting of a polysilicon layer and another polysilicon layer enriched with tungsten, another stacked film contains a polysilicon film enriched with nitrogen as the bottom layer, or other stacked films (8 and 9) combined with two of the above stacked films can be adopted as described in the ninth and tenth embodiments. Furthermore, still other stacking methods of the polysilicon layered films are known and used by those skilled in the art so that the present invention is not restricted to such methods.

What is claimed is:

1. A complementary metal-insulator-semiconductor device comprising:

a first transistor region having a first conductivity type and formed in a surface of a semiconductor substrate;

a second transistor region having a second conductivity type which is opposite the first conductivity type, the second transistor region formed in the surface of the semiconductor substrate and isolated from the first transistor region;

a first field effect transistor including:

a) a first gate oxide film formed on the first transistor region;

b) a source region and a drain region which are formed in the first transistor region; and c) a first gate polysilicon film having a top surface, said first gate polysilicon film being formed on the first gate oxide film and doped with an impurity having a conductivity type which is opposite the first conductivity type;

a second field effect transistor including:

a) a second gate oxide film formed on the second transistor region;

b) a source region and a drain region which are formed in the second transistor region; and c) a second gate polysilicon film having a top surface, said second gate polysilicon film being formed on the second gate oxide film and doped with an impurity having a conductivity type which is opposite the second conductivity type; and an oxide film formed by an oxidation process, said oxide film is located between said first and second gate polysilicon films and has a top surface; and a silicide film or a refractory metal film being provided on and directly contacting a portion of said top surface of the first and second gate polysilicon films not covered by said oxide film, and being provided simultaneously on an exposed portion the top surface of said oxide film.

* * * * *